(12) United States Patent
Natori et al.

(10) Patent No.: US 6,602,344 B2
(45) Date of Patent: Aug. 5, 2003

(54) CERAMIC FILM AND METHOD OF MANUFACTURING THE SAME, SEMICONDUCTOR DEVICE, AND PIEZOELECTRIC DEVICE

(75) Inventors: Eiji Natori, Chino (JP); Koichi Furuyama, Sayama (JP); Yuzo Tasaki, Hachioji (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/879,889

(22) Filed: Jun. 14, 2001

(65) Prior Publication Data
US 2002/0035961 A1 Mar. 28, 2002

(30) Foreign Application Priority Data

Jun. 21, 2000 (JP) .......................................... 2000-186529
Jun. 13, 2001 (JP) .......................................... 2001-178839

(51) Int. Cl.$^7$ ............................................. C30B 25/02
(52) U.S. Cl. ........................ 117/54; 427/252; 438/680; 438/681; 438/683; 438/685
(58) Field of Search ........................... 438/3, 680, 681, 438/683, 685; 427/252

(56) References Cited

U.S. PATENT DOCUMENTS

| | | | |
|---|---|---|---|
| 5,811,153 A | | 9/1998 | Hashimoto et al. |
| 6,001,416 A | | 12/1999 | Moriyama et al. |
| 6,060,391 A | * | 5/2000 | Tatsumi ..................... 438/680 |
| 6,146,905 A | * | 11/2000 | Chivukula et al. ............ 438/3 |
| 6,232,167 B1 | * | 5/2001 | Satoh et al. ................ 438/240 |

FOREIGN PATENT DOCUMENTS

| | | |
|---|---|---|
| JP | A 1-301590 | 12/1989 |
| JP | 8-245263 | 9/1996 |
| JP | 8-253324 | 10/1996 |
| JP | 9-286619 | 11/1997 |
| JP | A 11-195765 | 7/1999 |

* cited by examiner

Primary Examiner—Felisa Hiteshew
(74) Attorney, Agent, or Firm—Oliff & Berridge, PLC.

(57) ABSTRACT

A method of manufacturing a ceramic film includes a step of forming a ceramic film 30 by crystallizing a raw material body 20. The raw material body 20 contains different types of raw materials in a mixed state. The different types of raw materials differ from one another in at least one of a crystal growth condition and a crystal growth mechanism in the crystallization of the raw materials. According to this manufacturing method, a surface morphology of the ceramic film can be improved.

46 Claims, 10 Drawing Sheets

CERAMIC FILM AND METHOD OF MANUFACTURING THE SAME, SEMICONDUCTOR DEVICE, AND PIEZOELECTRIC DEVICE

Japanese Patent Application No. 2000-186529, filed on Jun. 21, 2000, and Japanese Patent Application No. 2001-178839, filed on Jun. 13, 2001, are hereby incorporated by reference in their entirety.

TECHNICAL FIELD

The present invention relates to a ceramic film and a method of manufacturing the ceramic film, a semiconductor device, and a piezoelectric device.

BACKGROUND OF THE INVENTION

As a ferroelectric film applied to semiconductor devices (ferroelectric memories (FeRAM), for example), ferroelectric films having a layered perovskite structure (BiLaTiO-based, BiTiO-based, and SrBiTaO-based ferroelectric films, for example) have been proposed. These ferroelectric films having a layered perovskite structure are generally formed by allowing crystals to grow from an amorphous state.

In the case of forming a ferroelectric film having a layered perovskite structure using this formation method, the crystal growth rate in the c-axis direction becomes lower than those in the a-axis direction and the b-axis direction due to the crystal structure of the ferroelectric film. Specifically, crystals tend to grow in the a-axis direction and the b-axis direction. Therefore, the ferroelectric film having a layered perovskite structure formed by using the above method has a rough surface morphology. Specifically, openings (holes or grooves, for example) are formed between crystals in the resulting ferroelectric film.

SUMMARY OF THE INVENTION

An objective of the present invention is to provide a method of manufacturing a ceramic film capable of improving the surface morphology of the ceramic film.

Another objective of the present invention is to provide a ceramic film obtained by the method of manufacturing a ceramic film of the present invention.

Yet another objective of the present invention is to provide a semiconductor device and a piezoelectric device to which the ceramic film of the present invention is applied.

Method of Manufacturing Ceramic Film (A) A first method of manufacturing a ceramic film of the present invention comprises:

a step of forming a ceramic film by crystallizing a raw material body, wherein the raw material body includes different types of raw materials in a mixed state; and wherein the different types of raw materials differ from one another in at least one of a crystal growth condition and a crystal growth mechanism in the crystallization of the raw materials.

The different types of raw materials differ from one another in at least one of the crystal growth condition and the crystal growth mechanism in the crystallization of the raw materials. Specifically, the raw materials are judged to be different depending on whether or not they differ from one another in at least one of the crystal growth condition and the crystal growth mechanism.

The crystal growth conditions and the crystal growth mechanism during crystallization of the raw materials include crystallization temperature, crystal nucleus formation temperature, crystal growth temperature, crystal growth rate, crystal nucleus formation rate, size of crystal nuclei, crystallization method, and the like.

In the present invention, the raw material body includes the different types of raw materials. Specifically, the raw material body includes at least two types of raw materials. The different types of raw materials differ from one another in at least one of the crystal growth condition and the crystal growth mechanism in the crystallization of the raw materials. Therefore, one of the raw materials can be crystallized prior to the other raw material, and then the other raw material can be crystallized in the openings between crystals which have been produced first by controlling various conditions, for example. Specifically, the openings between crystals produced from one of the raw materials can be filled with crystals produced from the other raw material. Therefore, the surface morphology of the ceramic film can be improved.

Moreover, the raw materials may be crystallized at the same time by controlling various conditions. For example, the crystallization temperature can be adjusted by allowing a metal element of the raw material to be replaced by other element. This enables the crystallization temperatures of the different types of raw materials to be approximately the same. The different types of raw materials can be crystallized at the same time by allowing the crystallization temperatures of the different types of raw materials to be approximately the same.

(B) A second method of manufacturing a ceramic film of the present invention comprises:

a step of forming a ceramic film by crystallizing a raw material body, wherein the raw material body includes different types of raw materials in a mixed state; and wherein the different types of raw materials differ from one another in crystal structures produced from the raw materials.

The different types of raw materials differ from one another in crystal structures produced from the raw materials. Specifically, the raw materials are judged to be different depending on whether or not they differ from one another in the crystal structures of the crystals obtained from the raw materials.

When the crystals obtained from the raw materials are expressed as $(Bi_2O_2)^{2+}(A_{m-1} B_m O_{3m+1})^{2-}$, the differences in the crystal structures of the crystals obtained from the raw materials include a difference in values for m, for example.

In the present invention, the different types of raw materials differ from one another in the crystal structure of the crystals produced from the raw materials. If they differ in the crystal structures of the crystals obtained from the raw materials, they also differ in the crystal growth conditions and the crystal growth mechanism of the raw materials. Therefore, the same effects as in the first method of manufacturing a ceramic film of the present invention can be obtained.

(C) A third method of manufacturing a ceramic film of the present invention comprises:

a step of forming a ceramic film by crystallizing a raw material body, wherein the raw material body includes different types of raw materials in a mixed state; and wherein the different types of raw materials are individually crystallized at least at an initial stage of crystallization.

The different types of raw materials are individually crystallized at least at an initial stage of crystallization.

In the third method of manufacturing a ceramic film of the present invention, the different types of raw materials are individually crystallized at least at an initial stage of crystallization. Therefore, crystals produced from one of the raw materials can be allowed to grow in the openings between crystals produced from the other raw material. As a result, formation of openings between the crystals can be prevented, whereby the surface morphology is improved.

The first to third methods of manufacturing a ceramic film of the present invention have at least any one of the following features.

(a) The ceramic film may be a ferroelectric film.

(b) The ceramic film may be a paraelectric film.

(c) The ceramic film may include ferroelectric and paraelectric materials in a mixed state.

(d) At least two of the different types of raw materials may differ from each other in a crystallization temperature in the crystallization of the raw materials.

(e) At least two of the different types of raw materials may differ from each other in a crystal nucleus formation temperature in the crystallization of the raw materials.

(f) At least two of the different types of raw materials may differ from each other in a crystal growth temperature in the crystallization of the raw materials.

(g) At least two of the different types of raw materials may differ from each other in a crystal growth rate in the crystallization of the raw materials.

(h) At least two of the different types of raw materials may differ from each other in a crystal nucleus formation rate in the crystallization of the raw materials.

(i) At least two of the different types of raw materials may differ from each other in the size of crystal nuclei in the crystallization of the raw materials.

(j) At least two of the different types of raw materials may differ from each other in a crystallization method for the raw materials.

(k) There may be a time-lag between the crystallizations of the different types of raw materials.

(l) There may be a time-lag between the formations of crystal nuclei in the crystallization of the different types of raw materials.

(m) The different types of raw materials may be crystallized at the same time.

In the case of crystallizing the different types of raw materials at the same time, crystals produced from one of the raw materials interrupt the growth of crystals produced from the other raw material. As a result, the resulting crystals can be microcrystallized. If the crystals are microcrystallized, the openings between the crystals become narrow, whereby the surface morphology is improved.

In the case of crystallizing the different types of raw materials at the same time, raw materials which produce ceramics having different crystal structures may be used. This enables the crystal growth conditions and the crystal growth mechanism during crystallization of the raw materials to be simultaneously changed.

(n) When ceramics obtained from the raw materials are expressed as $(Bi_2O_2)^{2+}(A_{m-1}B_mO_{3m+1})^{2-}$ the different types of raw materials may have different values for m.

(o) The raw material body may be formed on a substrate by the liquid source misted chemical deposition (LSMCD) method.

In the case of forming the raw material body on the substrate by the LSMCD method, the raw material body is provided onto the substrate in the form of a fine mist by ultrasonic waves. This improves the mixing conditions for the different types of raw materials. Therefore, a ceramic film having microcrystals can be obtained.

The raw material body may be formed on a substrate by separately providing the different types of raw materials.

Alternatively, the raw material body may be formed on the substrate by providing the different types of raw materials at the same time.

(p) The raw material body may be formed on a substrate by spin coating or dipping.

(q) The raw materials may be at least one of a sol-gel raw material and an MOD raw material.

(r) The raw material body may include a sol-gel raw material and an MOD raw material.

In the above (p) and (q), the sol-gel raw material may be polycondensed by hydrolysis.

The sol-gel raw material may have a crystal structure equal to or similar to the crystal structure of crystals obtained by crystallizing the raw materials. This makes it possible to easily crystallize the sol-gel raw material.

The MOD raw material may be a polynuclear complex raw material. (s) The raw material body may include different types of sol-gel raw materials; and the different types of sol-gel raw materials may differ from one another in one of a degree of polycondensation and a metal element composition. (t) The raw material body may include different types of sol-gel raw materials; and the different types of sol-gel raw materials may not be mixed at an atomic level.

The term "mixed at an atomic level" means that atoms which make up the raw materials are mixed. Specifically, the raw materials are preferably mixed in a state in which individual molecules or aggregates are maintained. In the case where the raw materials are not mixed at an atomic level, the effects of the present invention can be obtained reliably. Moreover, characteristics of the ceramic film can be further improved.

(D) A fourth method of manufacturing a ceramic film of the present invention comprises:

a step of forming a ceramic film by crystallizing a raw material body, wherein the raw material body is crystallized into a plurality of phases.

This ceramic film has any of the following features.

(a) The ceramic film may be a ferroelectric film.

(b) The ceramic film may be a paraelectric film.

(c) The ceramic film may include a ferroelectric and a paraelectric in a mixed state.

(E) A fifth method of manufacturing a ceramic film of the present invention comprises:

a step of forming a ceramic film by crystallizing a ceramic raw material liquid which includes a first raw material liquid and a second raw material liquid, wherein the first raw material liquid and the second raw material liquid are different types of liquids;

wherein the first raw material liquid is used to produce a ferroelectric having a Bi-based layered perovskite structure; and wherein the second raw material liquid is used to produce an ABO-type oxide in which Bi is provided in the A site.

A ferroelectric film having specific characteristics at a lower temperature can be formed by forming a ceramic film by using the ceramic raw material liquid of the present invention. A ceramic film obtained by using the ceramic raw material liquid of the present invention excels in the surface morphology.

A molar ratio of the ferroelectric produced from the first raw material liquid to the ABO-type oxide produced from the second raw material liquid may be from 100:20 to 100:100. This enables a ferroelectric film having specific characteristics at a lower temperature to be formed more reliably.

The first raw material liquid may be a solution in which a metal compound or a metal-inorganic compound of a metal element for the ferroelectric is dissolved in a solvent; and the second raw material liquid may be a solution in which a metal compound or a metal-inorganic compound of a metal element for the ABO-type oxide is dissolved in a solvent.

(F) A sixth method of manufacturing a ceramic film of the present invention comprises:

a step of forming a ceramic film by crystallizing a ceramic raw material liquid which includes a third raw material liquid and a fourth raw material liquid, wherein the third raw material liquid and the fourth raw material liquid are different types of liquids;

wherein the third raw material liquid is used to produce a PZT ferroelectric; and wherein the fourth raw material liquid is used to produce an ABO-type oxide in which Pb is provided in the A site.

The same effects as in the fifth method of manufacturing a ceramic film of the present invention can be obtained by forming a ceramic film by using these ceramic raw material liquids, for example.

A molar ratio of the ferroelectric produced from the third raw material liquid to the ABO-type oxide produced from the fourth raw material liquid may be from 100:20 to 100:100. This enables a ferroelectric film having specific characteristics at a lower temperature to be formed more reliably.

The third raw material liquid may be a solution in which a metal compound or a metal-inorganic compound of a metal element for the ferroelectric is dissolved in a solvent; and the fourth raw material liquid may be a solution in which a metal compound or a metal-inorganic compound of a metal element for the ABO-type oxide is dissolved in a solvent.

(G) A seventh method of manufacturing a ceramic film of the present invention comprises:

a step of forming a ceramic film by crystallizing a ceramic raw material liquid which includes a fifth raw material liquid and a sixth raw material liquid, wherein the fifth raw material liquid is used to produce a ferroelectric having a Bi-based layered perovskite structure or a PZT type ferroelectric; and wherein the sixth raw material liquid is used to produce an ABO-type oxide in which Ge is provided in the B site.

The same effects as in the fifth method of manufacturing a ceramic film of the present invention can be obtained by forming a ceramic film by using these ceramic raw material liquids, for example.

A molar ratio of the ferroelectric produced from the fifth raw material liquid to the ABO-type oxide produced from the sixth raw material liquid may be from 100:20 to 100:100. This enables a ferroelectric film having specific characteristics at a lower temperature to be formed more reliably.

The fifth raw material liquid may be a solution in which a metal compound or a metal-inorganic compound of a metal element for the ferroelectric is dissolved in a solvent; and the sixth raw material liquid may be a solution in which a metal compound or a metal-inorganic compound of a metal element for the ABO-type oxide is dissolved in a solvent.

(H) An eighth method of manufacturing a ceramic film of the present invention comprises:

a step of forming a raw material body layer in which a plurality of raw material layers are layered; and a step of forming a ceramic film by crystallizing the raw material body layer, wherein an uppermost raw material layer in the raw material body layer has a crystallization temperature lower than a crystallization temperature of a lower raw material layer which is in contact with the uppermost raw material layer, and produces crystals having no layered structure.

According to the present invention, the crystals produced from the uppermost raw material layer function as a seed layer during crystallization of the lower raw material layer. Moreover, since the crystals obtained from the uppermost raw material layer have no layered structure, the surface morphology of the ceramic film can be improved.

The lower raw material layer which is in contact with the uppermost raw material layer may be formed on a substrate with a first raw material layer interposed; and the first raw material layer may have a crystallization temperature lower than the crystallization temperature of the lower raw material layer which is in contact with the uppermost raw material layer. This ensures that crystals produced from the first raw material layer function as a seed layer during crystallization of the lower raw material layer in contact with the uppermost raw material layer.

(I) A ninth method of manufacturing a ceramic film of the present invention comprises:

a step of forming a raw material body layer which includes a raw material laminate in which a first raw material layer, a second raw material layer, and a third raw material layer are layered in that order; and a step of forming a ceramic film by crystallizing the raw material body layer, wherein the second raw material layer has a crystallization temperature lower than crystallization temperatures of the first and third raw material layers.

According to the present invention, crystals produced from the second raw material layer function as a stopper for preventing the growth of crystals in the first raw material layer and the third raw material layer. Therefore, the grain size of the crystals produced from the first raw material layer and the third raw material layer can be reduced.

A fourth raw material layer may further be layered on the third raw material layer; and the fourth raw material layer may have a crystallization temperature lower than the crystallization temperature of the third raw material layer. In this case, crystals produced from the fourth raw material layer function as a seed layer during crystallization of the third raw material layer.

(J) A tenth method of manufacturing a ceramic film of the present invention comprises:

a step of forming a raw material body layer in which a plurality of raw material layers are layered; and a step of forming a ceramic film by crystallizing the raw material body layer, wherein an uppermost raw material layer in the raw material body layer has a crystallization temperature higher than a crystallization temperature of a lower raw material layer which is in contact with the uppermost raw material layer.

According to the present invention, crystals produced from the uppermost raw material layer can be formed so as to cover crystals produced from the lower raw material layer.

Crystals obtained from the uppermost raw material layer in the raw material body layer may have no layered structure. This enables the surface morphology of the ceramic film to be improved.

In the first to tenth methods for manufacturing a ceramic film of the present invention, the step of forming a ceramic film by crystallizing the raw material body may be repeatedly performed two or more times.

Ceramic Film

A ceramic film of the present invention is obtained by the method of manufacturing a ceramic film of the present invention.

Application Examples of Ceramic Film

A semiconductor device of the present invention comprises a capacitor including the ceramic film of the present invention.

A piezoelectric device of the present invention comprises the ceramic film of the present invention.

DETAILED DESCRIPTION OF THE EMBODIMENT

Preferred embodiments of the present invention are described below with reference to the drawings.

First Embodiment

1. Method of Manufacturing Ceramic Film

Figure 1A:
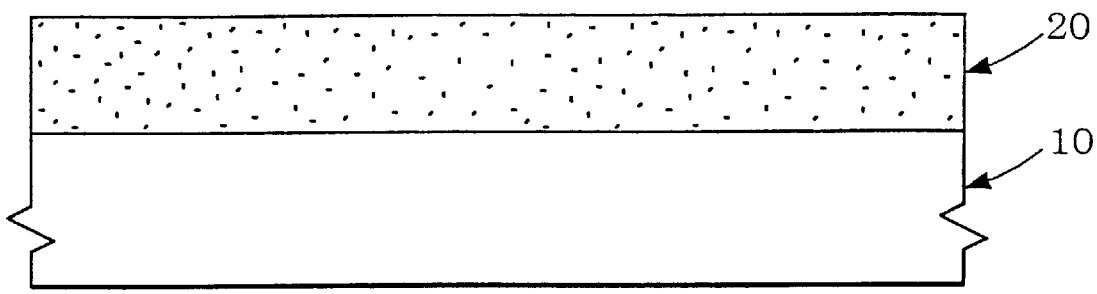
FIGS. 1A to 1C are cross-sectional views schematically showing manufacturing steps of a ceramic film using a ceramic raw material liquid according to an embodiment.
Figure 1B:
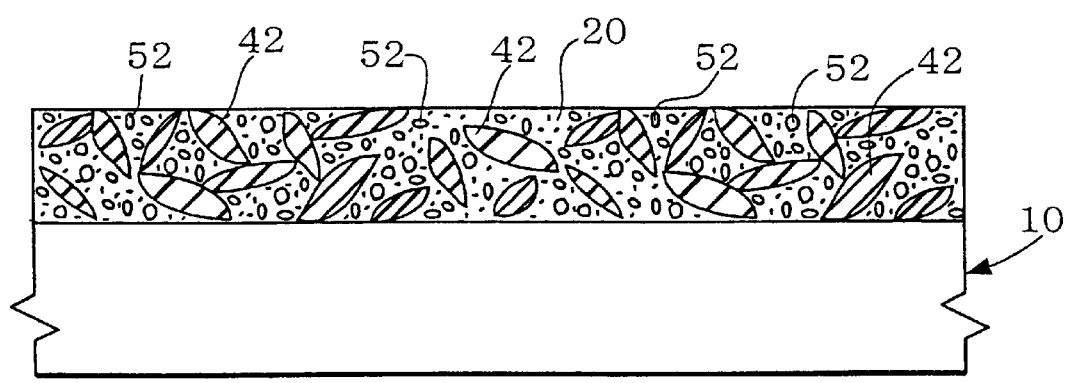
Figure 1C:
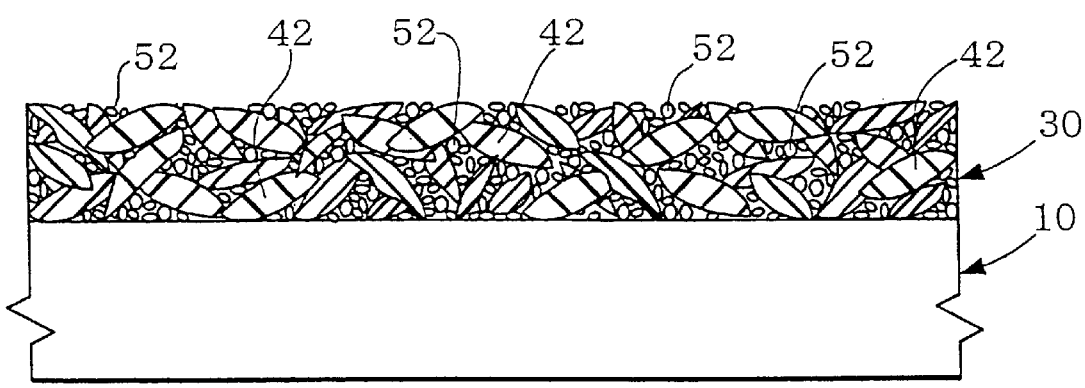

A method of manufacturing a ceramic film according to the present embodiment is described below. FIGS. 1A to 1C are cross-sectional views schematically showing the manufacturing steps for a ceramic film according to the present embodiment. Of these figures, FIG. 1B is a conceptual view showing a concept of the crystallization mechanism.

(i) A raw material body 20 is formed on a substrate 10 as shown in FIG. 1A. As a method of forming the raw material body 20 on the substrate 10, coating methods, the LSMCD method, and the like can be given. The coating methods include spin-coating and dipping. The raw material body 20 contains a sol-gel raw material and an MOD raw material. As the sol-gel raw material, a raw material having a crystallization temperature lower than that of the MOD raw material, and a crystal nucleus formation rate and a crystal growth rate higher than those of the MOD raw material is selected.

The sol-gel raw material is prepared as follows. Metal alkoxides having four or less carbon atoms are mixed and subjected to hydrolysis and polycondensation. A strong M—O—M—O . . . bond is formed by hydrolysis and polycondensation. The resulting M—O—M bond has a structure close to the crystal structure of ceramics (perovskite structure). Note that M represents a metal element (Bi, Ti, La, Pb, for example), and O represents oxygen. Metal elements and the ratio of metal elements are appropriately determined depending on desired ceramics. Taking BiLaTiO-based (hereinafter called "BLT") ceramics as an example, the ratio is expressed as $Bi_{3.25} La_{0.75}Ti_3O_x$. The value for O is indicated by X, which is not a final value. A solvent is added to the product obtained by hydrolysis and polycondensation to obtain a raw material. The sol-gel raw material is prepared in this manner.

As examples of the MOD raw material, a polynuclear metal complex raw material in which constituent elements for ceramics are continuously connected either directly or indirectly to each other can be given. As specific examples of the MOD raw material, metal salts of carboxylic acids can be given. As examples of carboxylic acids, acetic acid, 2-ethylhexanoic acid, and the like can be given. As examples of metals, Bi, Ti, La, and Pb can be given. The MOD raw material (polynuclear metal complex raw material) includes an M—O bond in the same manner as in the sol-gel raw material. However, the M—O bond does not form a continuous bond as in the case of the sol-gel raw material obtained by polycondensation. Moreover, the bond structure of the M—O bond is close to a linear structure and completely different from the perovskite structure.

The raw material body 20 is optionally dried.

(ii) The raw material body 20 is crystallized by subjecting the raw material body 20 to a thermal treatment, thereby forming a ceramic film 30, as shown in FIG. 1C. The raw material body 20 is crystallized under conditions whereby the sol-gel raw material and the MOD raw material are individually crystallized at least at an initial stage of the crystal growth, whereby first crystals 42 produced from the sol-gel raw material and second crystals 52 produced from the MOD raw material are formed.

A specific example of the crystallization mechanism of the sol-gel raw material and the MOD raw material is described below. The sol-gel raw material has a crystallization temperature lower than that of the MOD raw material. The crystal nucleus formation rate and the crystal growth rate of the sol-gel raw material are higher than those of the MOD raw material. Therefore, the sol-gel raw material can be crystallized prior to the MOD raw material by controlling the temperature and the like. By crystallizing the sol-gel raw material prior to the MOD raw material, the MOD raw material remains in the openings between the first crystals 42 produced from the sol-gel raw material, as shown in FIG. 1B. Therefore, the second crystals 52 produced from the MOD raw material grow in the openings between the first crystals 42 produced from the sol-gel raw material. Each of the first crystals 42 and the second crystals 52 grows individually in this manner. Specifically, the second crystals 52 grow so that the openings between the first crystals 42 are filled with the second crystals 52. Moreover, directions in which the crystals tend to be orientated differ between the sol-gel raw material and the MOD raw material. Therefore, the first crystals 42 and the second crystals 52 interrupt the growth of the other, whereby the first crystals 42 and the second crystals 52 are easily microcrystallized. If the crystals are microcrystallized, openings between the crystals become smaller. As a result, the ceramic film 30 with an improved surface morphology can be formed.

Specific crystallization conditions for the raw material body are described below.

As a thermal treatment method, a method of annealing the raw material body by rapid thermal annealing (RTA) and furnace annealing (FA) in an oxygen atmosphere can be given.

More specific crystallization conditions for the raw material body are as follows. The raw material body is annealed at a temperature of 500 to 650° C. for a short period of time (5 to 30 seconds) by RTA, thereby producing microcrystal nuclei. At this time, crystal nuclei produced from the sol-gel raw material are formed first. During the growth of the crystals produced from the sol-gel raw material, crystal nuclei produced from the MOD raw material grow around these crystals. Crystallization is promoted by FA at a temperature of 600 to 650° C. for 10 to 30 minutes to obtain the ceramic film 30.

II. Modifications

The following modifications are applicable to the method of manufacturing a ceramic film according to the above embodiment.

(i) The combination of raw materials is not limited to the above embodiment. For example, the following combinations can be employed.

(1) Two or more sol-gel raw materials with different degrees of polycondensation may be used in combination. If the degrees of polycondensation differ, directions in which the crystal growth tends to proceed generally differ even if the compositions are the same. Because of this, in the case of mixing the raw materials with different degrees of polycondensation, these raw materials interrupt the crystal growth of the other since the directions in which the crystal growth tends to proceed are different, whereby micro crystallization can be achieved.

(2) Raw materials having compositions of different crystal structures may be used in combination. For example, raw materials satisfying the following conditions may be used.

Provided that ceramics obtained from the raw materials are expressed as $(Bi_2O_2)^{2+}(A_{m-1}B_mO_{3m+1})^{2-}$, raw materials having different values for m may be used. As an example of compounds in which m=1, $Bi_2WO_6$ can be given. As an example of compounds in which m=2, $Bi_3TiNbO_9$ can be given. As an example of compounds in which m=3, $Bi_4Ti_3O_{12}$ can be given. These compounds are all ferroelectrics, but have different crystal structures. Specifically, although these compounds have small differences in length along the a-axis and the b-axis, the length along the c-axis is 16.4 Å (1.64 nm) when m=1, 25.0 Å (2.50 nm) when m=2, and 32.8 Å (3.28 nm) when m=3. Since these compounds have different crystal structures, the crystal growth conditions and the crystal growth mechanism differ between the raw materials which produce these crystals.

In the case of using raw materials having compositions of different crystal structures, it is preferable that an element in the B site is common between the different raw materials for the following reasons. Specifically, even if the different raw materials are individually crystallized by allowing the crystal growth conditions and the crystal growth mechanism to be different, interdiffusion occurs to a large extent near the crystal grain boundary during the succeeding annealing step that takes a long time. In this case, if an element in the B site is replaced, characteristics of the ceramics tend to deteriorate.

(3) A raw material which produces crystals having the crystal structure $Bi_4Ti_3O_9$ (hereinafter called "BTO raw material") and a raw material which produces crystals having the crystal structure $PbTiO_3$ (hereinafter called "PTO raw material") may be used in combination. $PbTiO_3$ is a perovskite having a tetragonal structure. However, since PTO exhibits a small difference between the a-axis and the c-axis, the degree of crystal growth anisotropy caused by the crystal structure is small. Moreover, crystal nuclei are easily produced from the PTO raw material at a comparatively lower temperature. Therefore, in the case of mixing the BTO raw material with the PTO raw material at a lower ratio (about 10:1, for example) and allowing the crystal growth to occur, these materials interrupt the crystal growth of the other. Because of this, the resulting crystals are microcrystallized. This effect is more significant than in the case of crystals having the same layered perovskite structure.

(4) A raw material which produces ferroelectric crystals and a raw material which produces paraelectric crystals may be used in combination. The amounts of these raw materials to be mixed are determined depending on the characteristics of the desired ceramic film.

(5) A sol-gel raw material and an MOD raw material may be used in combination so that the crystal structures of crystals produced from these raw materials are different.

(6) Sol-gel raw materials with different degrees of polycondensation may be used in combination so that the crystal structures of crystals produced from these raw materials are different.

(ii) A ceramic film may be formed by repeatedly performing the method of manufacturing a ceramic film according to the present invention two or more times. A ceramic film may be formed by combining the method of manufacturing a ceramic film according to the present invention and a conventional method of manufacturing a ceramic film.

Figure 3:
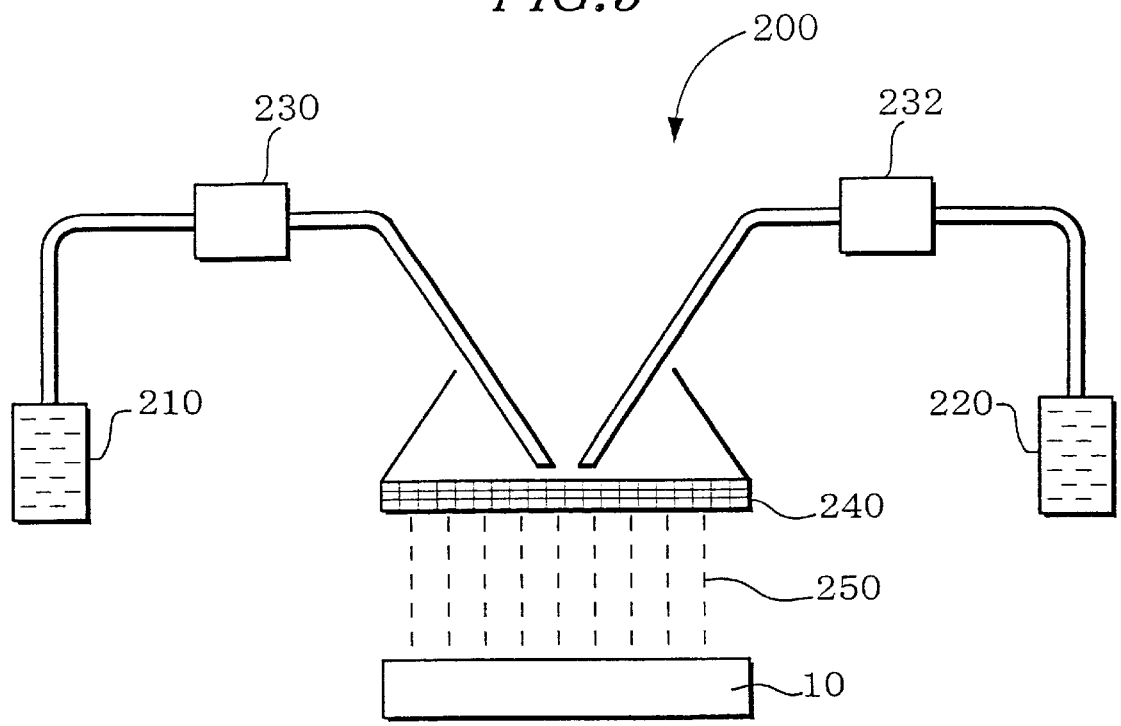
FIG. 3 is a cross-sectional view schematically showing a device for providing a raw material body on a substrate by using the LSMCD method.

(iii) As an example of a method of forming the raw material body on the substrate by using the LSMCD method, the following method can be given. FIG. 3 is a cross-sectional view schematically showing an apparatus 200 for providing the raw material body on the substrate by using the LSMCD method.

A first raw material 210 is sent to a mesh 240 through an atomizer 230. The first raw material 210 is passed through the mesh 240 to form mist 250, and fed onto the substrate 10. A second raw material 220 is sent to the mesh 240 through an atomizer 232. The second raw material 220 is passed through the mesh 240 to form the mist 250, and fed onto the substrate 10. A raw material body is formed by providing the mist 250 repeatedly to be deposited on the substrate 10. The diameter of droplets of the mist 250 is 10 to 200 nm, for example.

The first raw material 210 and the second raw material 220 may be fed onto the substrate 10 at the same time. The first raw material 210 and the second raw material 220 may be fed alternately.

Figure 4A:
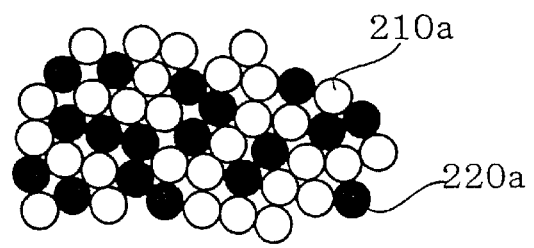
FIGS. 4A and 4B are conceptual views schematically showing the raw material body obtained using the apparatus shown in FIG. 3.

In the case of feeding the first raw material 210 and the second raw material 220 to the substrate 10 at the same time, the resulting raw material body has a structure in which first mist droplets 210a produced from the first raw material 210 and second mist droplets 220a produced from the second raw material 220 are mixed as shown in FIG. 4A, for example.

Figure 4B:
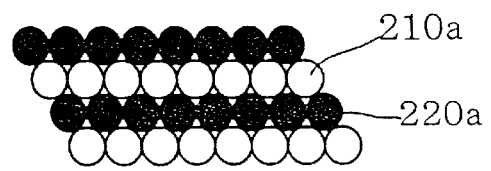

In the case of alternately feeding the first raw material 210 and the second raw material 220, the resulting raw material body has a structure in which each of the first mist droplets 210a produced from the first raw material 210 and the second mist droplets 220a produced from the second raw material 220 makes up layers as shown in FIG. 4B, for example. In other words, each layer is formed by the mist droplets formed of the same raw material.

Second Embodiment

I. First Ceramic Raw Material Liquid

A first ceramic raw material liquid is used by mixing a first raw material liquid and a second raw material liquid. The first ceramic raw material liquid may be a raw material liquid from which a ceramic film is obtained by thermal decomposition. The first raw material liquid and the second raw material liquid have a relation which produces different types of materials. The first and second raw material liquids may be: 1) a liquid in which a metal organic compound (metal alkoxide, metal carboxylic acid, for example) or a metal-inorganic compound (metal nitrate, metal chloride, for example) is dissolved in a solvent (water, alcohol, ester, aliphatic hydrocarbon, aromatic hydrocarbon, ketone, ether, or mixture of these, for example); 2) a liquid obtained by subjecting a metal compound to hydrolysis, condensation, and the like in a solvent; or 3) a sol-gel liquid obtained by hydrolysis of a metal alkoxide.

The first raw material liquid and the second raw material liquid are described below in more detail.

The first raw material liquid is a raw material liquid for manufacturing a ferroelectric having a Bi-based layered perovskite structure. As examples of ferroelectrics having a Bi-based layered perovskite structure, SrBiTaO-based ferroelectrics ($SrBi_2Ta_2O_9$, for example), BiLaTiO-based ferroelectrics ($Bi_{3.25}La_{0.75}Ti_3O_{12}$, for example), and BiTiO-based ferroelectrics ($Bi_4Ti_3O_{12}$, for example) can be given. The first raw material liquid contains metal elements which make up a ferroelectric. The amounts of constituent metal elements for a ferroelectric contained in the first raw material liquid are determined taking into consideration the amount of the desired ferroelectric and the ratio of the number of atoms of constituent metal elements in the desired ferroelectric.

As specific examples of the first raw material liquid, in the case of SrBiTaO-based ferroelectrics, a liquid in which solutions of an alkoxide of strontium, an alkoxide of bismuth, and an alkoxide of tantalum are mixed in 2-methoxyethanol can be given. The concentrations of an alkoxide of strontium, an alkoxide of bismuth, and an alkoxide of tantalum in the first raw material liquid may be 0.05 mol/l, 0.1 mol/l, and 1.0 mol/l, respectively. Specifically, the concentrations may be set so that 0.05 mol of an $SrBi_2Ta_2O_9$ ferroelectric is produced per liter of the first raw material liquid.

The second raw material liquid is a raw material liquid for manufacturing an ABO-type oxide in which Bi is provided in the A site. If the element in the A site is not Bi, elements other than Bi may be positioned at the site of the Bi-based layered perovskite structure at which Bi should be positioned, whereby the characteristics of the ferroelectric film may be adversely affected. As examples of the ABO-type oxide in which Bi is provided in the A site, BiGeO-based oxides ($Bi_4Ge_3O_{12}$, for example), BiMoO-based oxides ($Bi_2MoO_6$), BiVO-based oxides ($Bi_2VO_6$), BiCrO-based oxides ($Bi_2CrO_6$), BiSiO-based oxides ($Bi_4Si_3O_{12}$), and BiWO-based oxides ($Bi_4W_3O_{12}$) can be given. The crystallization temperature of crystals produced from the second raw material liquid can be changed by changing an element in the B site for the ABO-type oxide. The ABO-type oxide may be either a ferroelectric or a paraelectric.

The second raw material liquid contains metal elements which make up the ABO-type oxide. The amounts of constituent metal elements for the ABO-type oxide contained in the second raw material liquid are determined taking into consideration the amount of the desired ABO-type oxide and the ratio of the number of atoms of constituent metal elements in the desired ABO-type oxide.

As specific examples of the second raw material liquid, in the case of a BiGeO-based oxide, a liquid in which solutions of an alkoxide of bismuth and an alkoxide of germanium are mixed in 2-methoxyethanol can be given. The concentrations of an alkoxide of bismuth and an alkoxide of germanium in the second raw material liquid may be 0.20 mol/l and 0.15 mol/l, respectively. Specifically, the concentrations of an alkoxide of bismuth and an alkoxide of germanium may be set so that 0.05 mol of a $Bi_4Ge_3O_{12}$ oxide is produced per liter of the second raw material liquid.

The first raw material liquid and the second raw material liquid are preferably mixed so that the molar ratio of the ferroelectric produced from the first raw material liquid to the ABO-type oxide produced from the second raw material liquid is from 100:20 to 100:100. The reasons therefor are given in the description of examples below.

II. Example of Manufacturing Process of Ceramic Film

A ceramic film can be formed as described below by using the ceramic raw material liquid according to the present embodiment, for example. This manufacturing process for a ceramic film is described using FIGS. 1A to 1C which are cross-sectional views schematically showing the manufacturing steps for a ceramic film in the same manner as in the first embodiment.

(a) The substrate 10 is subjected to a thermal treatment. This thermal treatment is performed to remove moisture present on the surface of the substrate 10. The thermal treatment temperature is 180° C., for example.

(b) The ceramic raw material liquid is applied to the substrate 10, thereby forming the ceramic raw material body layer 20. Spin coating, dipping, or LSMCD can be used for this process.

(c) A solvent present in the ceramic raw material body layer 20 is evaporated by performing a drying thermal treatment. The solvent may be evaporated in a nitrogen atmosphere. The drying thermal treatment temperature is 160° C., for example.

(d) The ceramic raw material body layer 20 is subjected to a cleaning thermal treatment. Organic substances present in the ceramic raw material body layer 20 are decomposed by this thermal treatment. The organic substances may be decomposed in a nitrogen atmosphere. The thermal treatment temperature is 260° C., for example.

(e) The ceramic raw material body layer 20 is presintered. Crystal nuclei are formed during the presintering. Presintering may be performed in an oxygen atmosphere by RTA, for example.

(f) The ceramic raw material body layer 20 is sintered. Sintering may be performed in an oxygen atmosphere by FA, for example.

A cycle consisting of the steps (a) to (e) may be repeated two or more times.

III. Effects

Effects obtained by depositing a ceramic film using the ceramic raw material liquid according to the second embodiment are described below.

(1) In the case of forming a ferroelectric (SBT) film by sintering the ceramic raw material liquid consisting of only the first raw material liquid, desired characteristics (residual polarization, for example) necessary for the ferroelectric film cannot be generally obtained at a sintering temperature of less than about 700° C.

However, in the case of forming a ferroelectric film by sintering the first ceramic raw material liquid in which the first raw material liquid and the second raw material liquid are mixed, the desired characteristics necessary for the ferroelectric film can be obtained even at a sintering temperature of about 500° C., as described later. In other words, according to the present embodiment, a ferroelectric film having desired characteristics can be formed at a lower temperature.

(2) Different materials are produced from the first raw material liquid and the second raw material liquid. Therefore, a crystallization temperature at which the first raw material liquid is crystallized differs from a crystallization temperature at which the second raw material liquid is crystallized, for example. As a result, one of the raw material liquids can be crystallized prior to the other raw material liquid. Because of this, the crystals 52 produced from one of the raw material liquids can be allowed to grow between the crystals 42 produced from the other raw material liquid, as shown in FIG. 1B. Specifically, the crystals 42 produced from one of the raw material liquids and the crystals 52 produced from the other raw material liquid individually grow so that the openings between the crystals 42 are filled with the crystals 52. As a result, a ceramic film with an improved surface morphology can be formed.

(3) Allowing the direction in which the crystals produced from the second raw material liquid tend to be orientated to differ from the direction in which the crystals produced from the first raw material liquid tend to be orientated ensures that the crystal growth of the crystals produced from one of the raw material liquids is interrupted by the crystal growth of the other crystals. Therefore, crystals in the resulting ceramic film can be microcrystallized. As a result, a ceramic film with an improved surface morphology can be formed.

IV. Modifications

The following modifications are applicable to the second embodiment.

(1) A ceramic film may be formed by repeatedly performing the above manufacturing steps for a ceramic film two or more times. A ceramic film may be formed by combining the above manufacturing steps for a ceramic film and manufacturing steps for a ceramic film using a conventional raw material for a ceramic film.

(2) As a method for forming the raw material body on the substrate by using the LSMCD method, the following method can be given. FIG. 3 is a cross-sectional view schematically showing the apparatus 200 for forming the raw material body on the substrate by the LSMCD method.

The first raw material liquid 210 is sent to the mesh 240 through the atomizer 230. The first raw material liquid 210 is passed through the mesh 240 to form the mist 250, and fed onto the substrate 10. The second raw material liquid 220 is sent to the mesh 240 through the atomizer 232. The second raw material liquid 220 is passed through the mesh 240 to form the mist 250, and fed onto the substrate 10. The raw material body is formed by providing the mist 250 repeatedly to be deposited on the substrate 10. The diameter of droplets of the mist 250 is 10 to 200 nm, for example.

The first raw material liquid 210 and the second raw material liquid 220 may be fed onto the substrate 10 at the same time. The first raw material liquid 210 and the second raw material liquid 220 may be fed alternately.

In the case of feeding the first raw material liquid 210 and the second raw material liquid 220 onto the substrate 10 at the same time, the resulting raw material body has a structure in which the first mist droplets 210a formed of the first raw material liquid 210 and the second mist droplets 220a formed of the second raw material liquid 220 are mixed as shown in FIG. 4A, for example.

In the case of alternately feeding the first raw material liquid 210 and the second raw material liquid 220, the resulting raw material body has a structure in which each of the first mist droplets 210a formed of the first raw material liquid 210 and the second mist droplets 220a formed of the second raw material liquid 220 makes up layers as shown in FIG. 4B, for example. Specifically, each layer is formed by the mist droplets formed of the same raw material.

Third Embodiment

I. Second Ceramic Raw Material Liquid

A second ceramic raw material liquid is used by mixing a third raw material liquid and a fourth raw material liquid. The second ceramic raw material liquid may be a raw material liquid from which a ceramic film is obtained by thermal decomposition. The third raw material liquid and the fourth raw material liquid have a relation which produces different types of materials. The third and fourth raw material liquids may be: 1) a liquid in which a metal organic compound (metal alkoxide, metal carboxylic acid, for example) or a metal-inorganic compound (metal nitrate, metal chloride, for example) is dissolved in a solvent (water, alcohol, ester, aliphatic hydrocarbon, aromatic hydrocarbon, ketone, ether, or mixture of these, for example); 2) a liquid obtained by subjecting a metal compound to hydrolysis, condensation, and the like in a solvent; or 3) a sol-gel liquid obtained by hydrolysis of a metal alkoxide.

The third raw material liquid and the fourth raw material liquid are described below in more detail.

The third raw material liquid is a raw material liquid for manufacturing a PZT type ferroelectric. As examples of PZT type ferroelectrics, PbZrTiO-based ferroelectrics (PbZr$_y$Ti$_{1-y}$O$_3$, for example) and PbLaZrTiO-based ferroelectrics (Pb$_{1-x}$La$_x$Zr$_y$Ti$_{1-y}$O$_3$, for example) can be given. The third raw material liquid contains metal elements which make up a ferroelectric. The amounts of constituent metal elements for a ferroelectric contained in the third raw material liquid are determined taking into consideration the amount of the desired ferroelectric and the ratio of the number of atoms of constituent metal elements in the desired ferroelectric.

As specific examples of the third raw material liquid, taking a PbZrTiO-based ferroelectric as an example, a liquid in which lead acetate trihydrate, zirconium butoxide, and titanium isopropoxide are mixed in 1-methoxy-2-propanol can be given. The amounts of lead acetate trihydrate, zirconium butoxide, and titanium isopropoxide to be used are determined taking into consideration the ratio of the number of atoms of constituent metal elements in the desired ferroelectric and the amount of the desired ferroelectric.

The fourth raw material liquid is a raw material liquid for manufacturing an ABO-type oxide in which Pb is provided in the A site. If an element in the A site is not Pb, elements other than Pb may be positioned at the site of the PZT-based oxide at which Pb should be positioned, whereby the characteristics of the ferroelectric film may be adversely affected. As examples of the ABO-type oxide in which Pb is provided in the A site, PbGeO-based oxides (Pb$_5$Ge$_3$O$_{11}$), PbMoO-based oxides (Pb$_2$MoO$_5$), PbVO-based oxides (Pb$_2$VO$_5$), PbCrO-based oxides (Pb$_2$CrO$_5$), PbSiO-based oxides (Pb$_5$Si$_3$O$_{11}$), PbWO-based oxides (Pb$_2$WO$_5$), PbSnO-based oxides (PbSnO$_3$), and PbGeSiO-based oxides (Pb$_5$Ge$_2$SiO$_{11}$) can be given. The crystallization temperature of crystals produced from the second raw material liquid can be changed by changing an element in the B site for the ABO-type oxide. The ABO-type oxide may be either a ferroelectric or a paraelectric.

As specific examples of the fourth raw material liquid, taking a PbGeO-based oxide as an example, a liquid in which germanium ethoxide and lead butoxide are mixed in 1-methoxy-2-propanol can be given. The amounts of germanium ethoxide and lead butoxide to be used are determined taking into consideration the ratio of the number of atoms of constituent metal elements in the desired oxide and the amount of the desired oxide.

The third raw material liquid and the fourth raw material liquid are preferably mixed so that the molar ratio of the ferroelectric obtained from the third raw material liquid to the ABO-type oxide obtained from the fourth raw material liquid is from 100:20 to 100:100.

II. Second Example of Manufacturing Process of Ceramic Film

A method to produce a ceramic film from the second ceramic raw material liquid may be the method to produce a ceramic film from the first ceramic raw material liquid.

III. Effects

Effects obtained by depositing a ceramic film using the ceramic raw material liquid according to the third embodiment are described below.

(1) According to the ceramic raw material liquid according to the present embodiment, a ferroelectric film having specific characteristics can be obtained at a sintering temperature lower than the sintering temperature necessary for providing the specific characteristics in the case of forming a ferroelectric film by sintering only the third raw material liquid. In other words, according to the present embodiment, a ferroelectric film having desired characteristics can be formed at a lower temperature.

(2) Different materials are produced from the third raw material liquid and the fourth raw material liquid. Therefore, a crystallization temperature at which the third raw material liquid is crystallized differs from a crystallization temperature at which the fourth raw material liquid is crystallized, for example. As a result, a ceramic film with an improved surface morphology can be formed in the same manner as in the second embodiment.

The modifications illustrated in the second embodiment are also applicable to the third embodiment.

Fourth Embodiment

I. Third Ceramic Raw Material Liquid

A third ceramic raw material liquid is used by mixing a fifth raw material liquid and a sixth raw material liquid. The third ceramic raw material liquid may be a raw material liquid from which a ceramic film is obtained by thermal decomposition. The fifth raw material liquid and the sixth raw material liquid have a relation which produces different types of materials. The fifth and sixth raw material liquids may be: 1) a liquid in which a metal organic compound (metal alkoxide, metal carboxylic acid, for example) or a metal-inorganic compound (metal nitrate, metal chloride, for example) is dissolved in a solvent (water, alcohol, ester, aliphatic hydrocarbon, aromatic hydrocarbon, ketone, ether, or mixture of these, for example); 2) a liquid obtained by subjecting a metal compound to hydrolysis, condensation, and the like in a solvent; or 3) a sol-gel liquid obtained by hydrolysis of a metal alkoxide.

The fifth raw material liquid and the sixth raw material liquid are described below in more detail.

The fifth raw material liquid is a raw material liquid for manufacturing a ferroelectric having a Bi-based layered perovskite structure or a PZT type ferroelectric. As a ferroelectric having a Bi-based layered perovskite structure, ferroelectrics illustrated for the first ceramic raw material liquid can be applied. As a PZT type ferroelectric, ferroelectrics illustrated for the first ceramic raw material liquid can be applied. As specific examples of the fifth raw material liquid, in the case of a ferroelectric having a Bi-based layered perovskite structure, specific examples illustrated for the first raw material liquid (second embodiment) can be applied. In the case of a PZT type ferroelectric, specific examples illustrated for the third raw material liquid (third embodiment) can be applied.

The sixth raw material liquid is a raw material liquid for manufacturing an AGeO-based oxide. An oxide in which Ge is provided in the B site has a low melting point of about 700° C., whereby the process temperature can be decreased. As examples of elements in the A site for the AGeO-based oxide, alkaline earth metals, rare earth elements (Ce, in particular), Zr, Sr, and Bi can be given. As examples of a ZrGeO-based oxide, $ZrGeO_4$ can be given. As examples of an SrGeO-based oxide, $Sr_5Ge_3O_{11}$ can be given. As specific examples of the sixth raw material liquid, in the case of the BiGeO-based oxide, specific examples illustrated for the second raw material liquid (second embodiment) can be applied. The AGeO-based oxide may be either a paraelectric or a ferroelectric.

The fifth raw material liquid and the sixth raw material liquid are preferably mixed so that the molar ratio of the ferroelectric obtained from the fifth raw material liquid to the AGO-type oxide obtained from the sixth raw material liquid is from 100:20 to 100:100.

II. Third Example of Manufacturing Process of Ceramic Film

A method to produce a ceramic film from the third ceramic raw material liquid may be the method to produce a ceramic film from the first ceramic raw material liquid.

III. Effects

Effects obtained by depositing a ceramic film using the ceramic raw material liquid according to the fourth embodiment are described below.

(1) According to the ceramic raw material liquid according to the present embodiment, a ferroelectric film having specific characteristics can be obtained at a sintering temperature lower than the sintering temperature necessary for providing the specific characteristics in the case of forming a ferroelectric film by sintering only the fifth raw material liquid. In other words, according to the present embodiment, a ferroelectric film having desired characteristics can be formed at a lower temperature.

(2) A material produced from the fifth raw material liquid is different from a material produced from the sixth raw material liquid. Therefore, a crystallization temperature at which the fifth raw material liquid is crystallized differs from a crystallization temperature at which the sixth raw material liquid is crystallized, for example. As a result, a ceramic film with an improved surface morphology can be formed in the same manner as in the second embodiment.

(3) Allowing the direction in which crystals produced from the sixth raw material liquid tend to be orientated to differ from the direction in which the crystals produced from the fifth raw material liquid tend to be orientated ensures that the crystal growth of crystals produced from one of the raw material liquids is interrupted by the crystal growth of the other crystals. Therefore, crystals in the resulting ceramic film can be microcrystallized. As a result, a ceramic film with an improved surface morphology can be formed.

The modifications illustrated in the second embodiment are also applicable to the fourth embodiment.

Fifth Embodiment

Examples of manufacturing process of a multilayer ceramic film according to the fifth embodiment is described below.

I. Example of Manufacturing Process of First Multilayer Ceramic Film

Figure 5A:
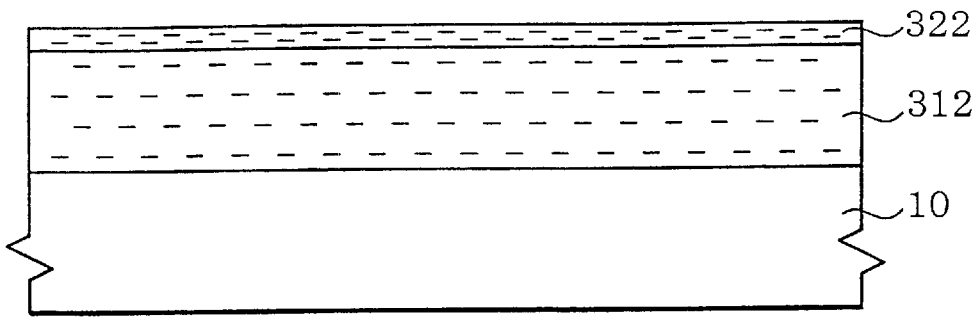
FIGS. 5A to 5C are conceptual views schematically showing manufacturing steps of a first multilayer ceramic film.
Figure 5A:
Figure 5B:
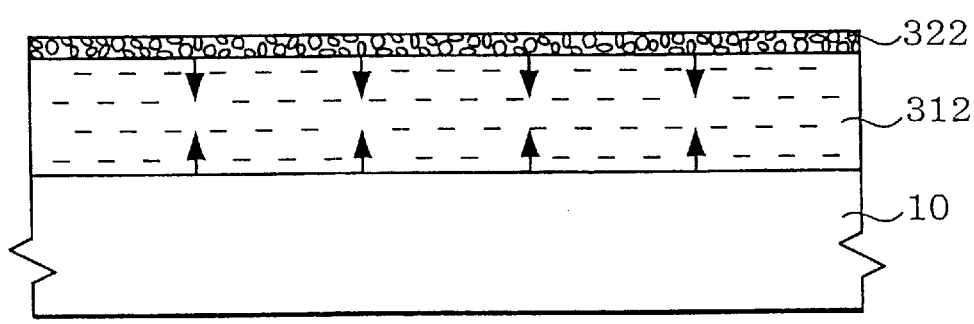
Figure 5B:
Figure 5C:
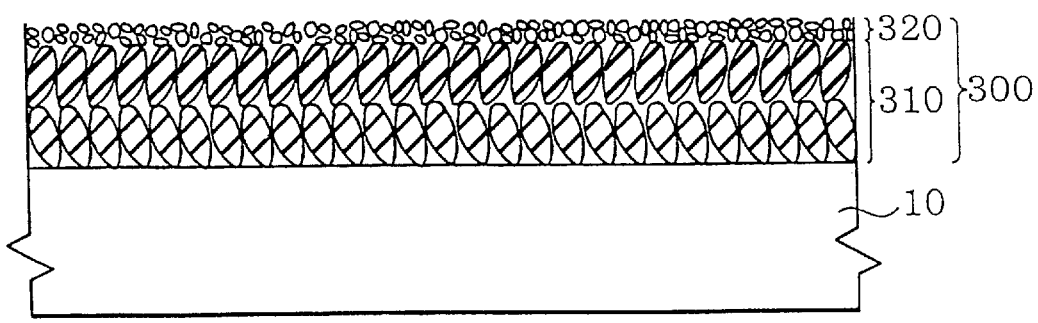

An example of manufacturing process of a first multilayer ceramic film is described below. FIGS. 5A to 5C are cross-sectional views schematically showing the manufacturing process for the first multilayer ceramic film.

A main liquid layer 312 for manufacturing a ferroelectric is formed on the substrate 10 using a coating method, as shown in FIG. 5A. As the material for the main liquid layer 312, the first raw material liquid in the second embodiment and the third raw material liquid in the third embodiment can be given.

A secondary liquid layer 322 for manufacturing either a ferroelectric or a paraelectric is formed on the main liquid layer 312. As the material for the secondary liquid layer 322, a material having a crystallization temperature lower than that of the material for the main liquid layer 312 is selected. In addition, a material which produces an oxide having no layered structure after crystallization is selected as the material for the secondary liquid layer 322. The material for the secondary liquid layer 322 differs depending on the material for the main liquid layer 312. In the case where an SBT-based ferroelectric is formed by crystallizing the main liquid layer 312, a BiGeO-based material, a BiSiO-based material, or an SrGeO-based material is used as the material for the secondary liquid layer 322, for example.

By performing a thermal treatment, the main liquid layer 312 and the secondary liquid layer 322 are crystallized as shown in FIG. 5C, thereby forming a ceramic film 300 consisting of a primary crystal layer 310 and a secondary crystal layer 320.

According to this example of manufacturing process of the first multilayer ceramic film, the following effects can be obtained.

As the material for the secondary liquid layer 322, a material having a crystallization temperature lower than that of the main liquid layer 312 is selected. Therefore, the secondary liquid layer 322 is crystallized prior to the main liquid layer 312 at an initial stage of crystallization, as shown in FIG. 5B. As a result, crystals produced in the secondary liquid layer 322 function as seeds during the crystallization of the main liquid layer 312. Therefore, crystallization of the main liquid layer 312 proceeds in directions from both the secondary liquid layer 322 and the substrate 10. This enables the grain size of crystals produced in the main liquid layer 312 to be decreased.

A material which produces an oxide having no layered structure after crystallization is used as the material for the secondary liquid layer 322. This allows crystals to grow isotropically in the secondary liquid layer 322. This results in formation of the secondary crystal layer 320 with a flat surface, whereby the surface morphology of the ceramic film 300 can be improved.

Figure 6A:
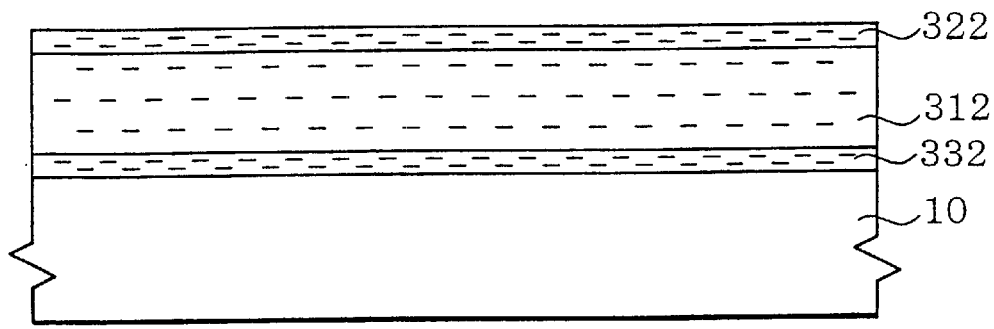
FIGS. 6A to 6C are conceptual views schematically showing manufacturing steps of a second multilayer ceramic film.
Figure 6A:
Figure 6B:
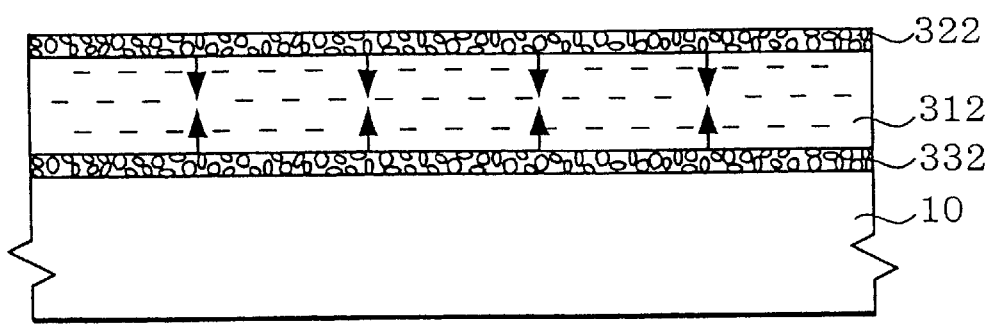
Figure 6B:
Figure 6C:
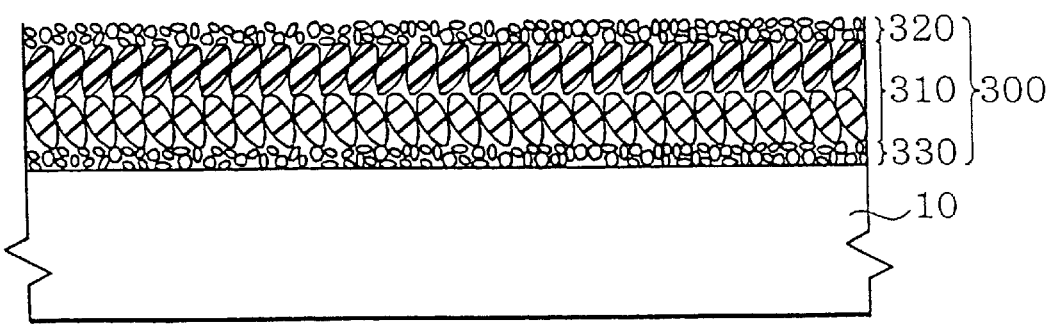

The ceramic film 300 consisting of the primary crystal layer 310 and the secondary crystal layer 320, 330 may be formed by allowing a secondary liquid layer 332 to be interposed between the substrate 10 and the main liquid layer 312, as shown in FIG. 6A.

II. Example of Manufacturing Process of Second Multilayer Ceramic Film

Figure 7A:
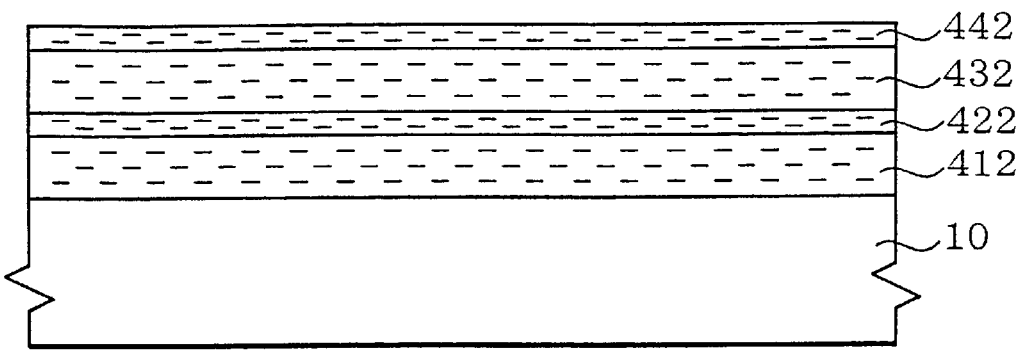
FIGS. 7A to 7C are conceptual views schematically showing manufacturing steps of a third multilayer ceramic film.
Figure 7B:
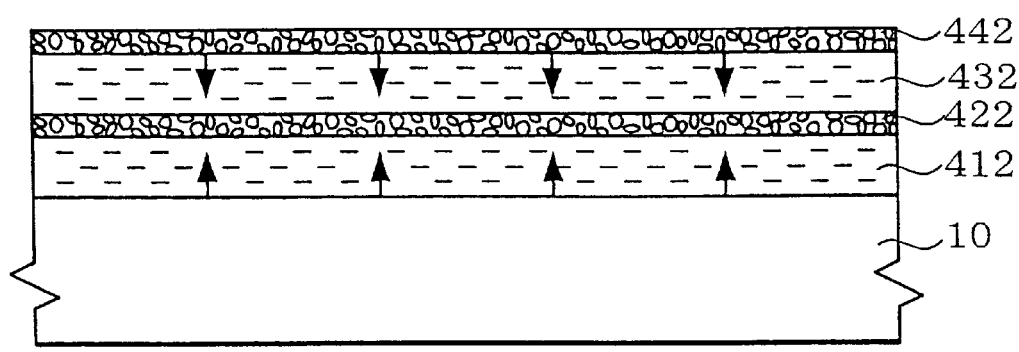
Figure 7C:
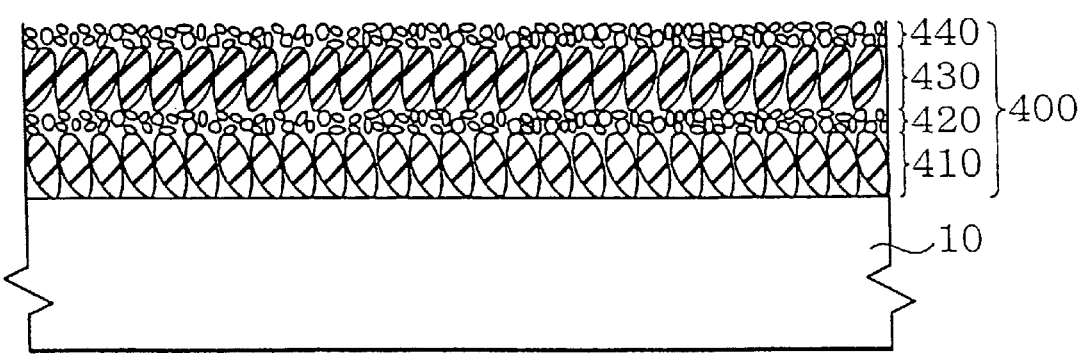

An example of manufacturing process of a second multilayer ceramic film is described below. FIGS. 7A to 7C are cross-sectional views schematically showing the manufacturing process of the second multilayer ceramic film.

This example of manufacturing process of the second multilayer ceramic film differs from the example of manufacturing process of the first multilayer ceramic film in that a secondary liquid layer 422 is interposed between main liquid layers 412 and 432.

Specifically, the main liquid layer 412, the secondary liquid layer 422, the main liquid layer 432, and the secondary liquid layer 442 are layered on the substrate 10 in that order. These layers are crystallized to form a ceramic film 400 consisting of primary crystal layers 410 and 430 and secondary crystal layers 420 and 440.

As the material for the secondary liquid layers 422 and 442, a material having a crystallization temperature lower than that of the main liquid layers 412 and 442 is selected in the same manner as in the example of manufacturing process of the first multilayer ceramic film.

Allowing the secondary liquid layer 422 to be interposed between the main liquid layers 412 and 432 in this manner ensures that crystals produced in the secondary liquid layer 422 function as a stopper for preventing the growth of crystals in the main liquid layers 412 and 432. Therefore, the grain size of the crystals in the primary crystal layers 410 and 430 formed on both sides of the secondary crystal layer 420 can be decreased.

III. Example of Manufacturing Process of Third Multilayer Ceramic Film

Figure 8A:
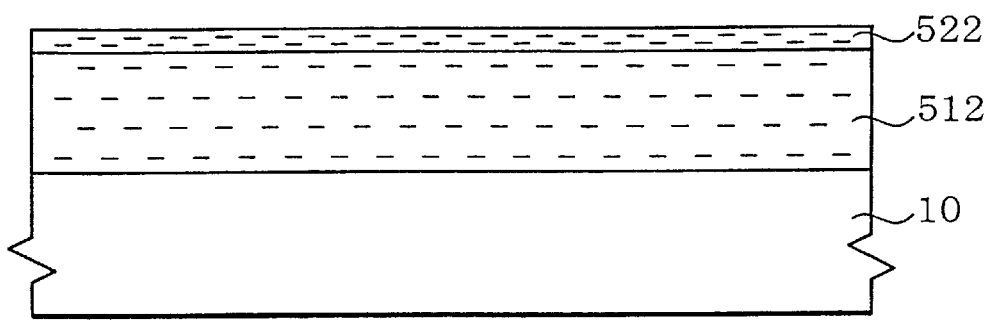
FIGS. 8A and 8B are conceptual views schematically showing manufacturing steps of a fourth multilayer ceramic film.
Figure 8A:
Figure 8B:
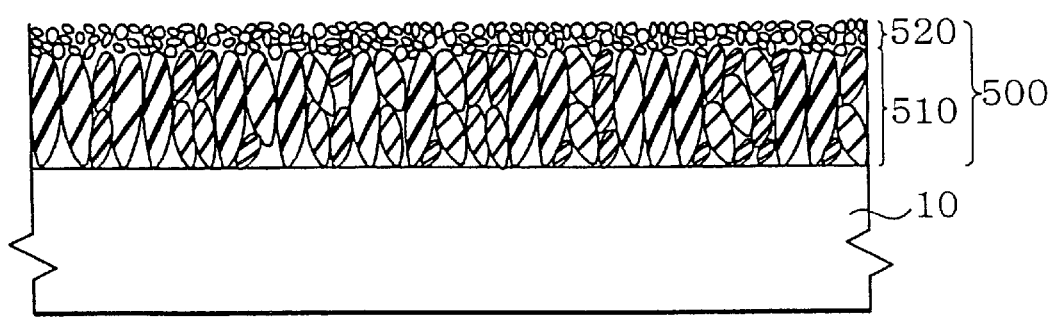

An example of manufacturing process of a third multilayer ceramic film is described below. FIGS. 8A and 8B are cross-sectional views schematically showing the manufacturing process of the third multilayer ceramic film.

This example of manufacturing process of the third multilayer ceramic film differs from the example of manufacturing process of the first multilayer ceramic film in that a material for a main liquid layer 512 has a crystallization temperature lower than that of a material for a secondary liquid layer 522.

As a material for the main liquid layer 512, the first raw material liquid in the second embodiment and the third raw material liquid in the third embodiment can be given. In the case where the material for the main liquid layer 512 produces a PZT type ferroelectric, the material for the secondary liquid layer 522 may be a PbWO-based material or a PbMoO-based material.

A ceramic film with an improved surface morphology can be formed by crystallizing the main liquid layer 512 and the secondary liquid layer 522. The reasons therefor are as follows. The material for the main liquid layer 512 has a crystallization temperature lower than that of the material for the secondary liquid layer 522. Therefore, crystallization of the secondary liquid layer 522 is delayed in comparison with the crystallization of the main liquid layer 512, whereby crystals produced from the secondary liquid layer 522 grow so as to cover a primary crystal layer 510 produced from the main liquid layer 512. Since the crystals produced from the secondary liquid layer 522 do not have a layered structure, the crystals produced from the secondary liquid layer 522 grow isotropically. Because of this, a secondary crystal layer 520 with a flat surface is formed. This decreases unevenness on the surface of a ceramic film 500, whereby the surface morphology of the ceramic film 500 can be improved.

In the above examples of manufacturing process of the first to third multilayer ceramic films, crystal grains produced from the main liquid layer and crystal grains produced from the secondary liquid layer may be individually diffused into the different crystal layers. Moreover, constituent metal elements for the main liquid layer may be diffused into the secondary liquid layer, or constituent metal elements for the secondary liquid layer may be diffused into the main liquid layer. Therefore, there may be a case where the interface between the primary crystal layer formed from the main liquid layer and the secondary crystal layer formed from the secondary liquid layer is not distinguishable.

Sixth Embodiment

I. Semiconductor Device

Figure 2:
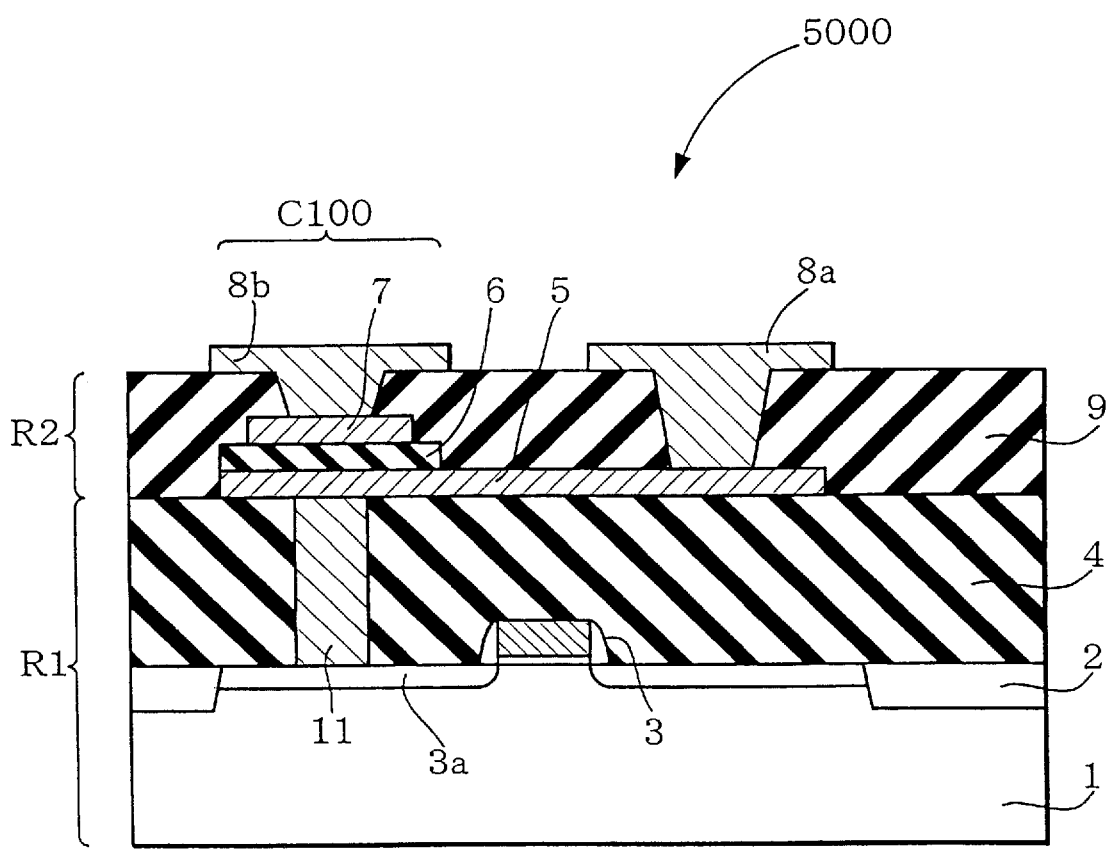
FIG. 2 is a plan view schematically showing a ferroelectric memory device.

A semiconductor device to which the ceramic film obtained by the method of manufacturing a ceramic film of the present invention is applied is described below. In the present embodiment, a ferroelectric memory device is illustrated as an example of the semiconductor device. FIG. 2 is a plan view schematically showing a ferroelectric memory device.

A ferroelectric memory device 5000 includes a CMOS region R1 and a capacitor region R2 formed on the CMOS region R1. Specifically, the CMOS region RI includes a semiconductor substrate 1, an element isolation region 2 and a MOS transistor 3 formed on the semiconductor substrate 1, and an interlayer dielectric 4. The capacitor region R2 includes a capacitor C100 consisting of a lower electrode 5, a ferroelectric film 6, and an upper electrode 7, an interconnect layer 8a connected to the lower electrode 5, an interconnect layer 8b connected to the upper electrode 7, and an insulating layer 9. The ferroelectric film 6 in the capacitor C100 is formed by the method of manufacturing a ceramic film of the present invention. An impurity diffusion layer 3a of the MOS transistor 3 and the lower electrode 5 which makes up the capacitor 5 are connected through a contact layer 11 formed of polysilicon or tungsten.

Effects of the ferroelectric device are described below.

(1) In the case of forming a ferroelectric film, the thickness of the ferroelectric film must be increased in order to prevent the occurrence of a short circuit between the upper electrode and the lower electrode, taking into consideration the formation of grooves or holes. A short circuit between the upper electrode and the lower electrode occurs significantly in the case where the upper electrode is formed of an iridium-based material (Ir, $IrO_2$). However, in the present embodiment, the ferroelectric film 6 of the ferroelectric device 5000 is formed using the method of manufacturing a ceramic film of the present invention. Therefore, the surface morphology of the ferroelectric film 6 is improved. As a result, the thickness of the ferroelectric film 6 can be decreased to such an extent that the surface morphology of the ferroelectric film 6 is improved. Therefore, according to the ferroelectric device 5000, a higher degree of integration can be achieved.

According to the present embodiment, the range of thickness of the ferroelectric film 6 for which an iridium-based material is used as the material for the upper electrode 7 can be increased. Specifically, the lower limit for the thickness of the ferroelectric film 6 for which an iridium-based material is used as the material for the upper electrode 7 can be decreased.

An iridium-based material has an advantage of having superior hydrogen barrier characteristics and fatigue characteristics compared to platinum (Pt).

(2) Etching the ferroelectric film in a state in which unevenness is formed on the surface of the ferroelectric film causes the unevenness formed on the surface of the ferroelectric film to be transferred to the surface of the lower electrode, which is an underlay for the ferroelectric film. This causes the surface morphology of the lower electrode to deteriorate. If the surface morphology of the lower electrode deteriorates, a contact failure may occur between the interconnect layer connected to the lower electrode and the lower electrode.

However, in the present embodiment, the surface morphology of the ferroelectric film 6 is improved. Therefore, deterioration of the surface morphology of the lower electrode 5 after etching the ferroelectric film 6 can be prevented. As a result, the interconnect layer 8a can be reliably connected to the lower electrode 9 electrically.

II. Modifications

The semiconductor device to which the ceramic film obtained by the method of manufacturing a ceramic film of the present invention can be applied is not limited to the ferroelectric memory. The semiconductor device may be applied to various types of semiconductor devices such as a DRAM. Specifically, the ceramic film of the present invention may be applied to a dielectric film for capacitors of a DRAM. In this case, the dielectric film may be formed of a paraelectric with a high dielectric constant, such as BST, from the viewpoint of an increased capacitance of the capacitors.

The ceramic film obtained by the method of manufacturing a ceramic film of the present invention may be applied not only to semiconductor devices, but also to other application fields such as a piezoelectric for piezoelectric devices used for actuators.

EXAMPLES

Some examples of the present invention will now be described below. The present invention is not limited to the following examples and other examples are possible so long as they remain within the scope of the invention.

Example 1

A main liquid was obtained as follows. 1100 ml of a toluene solution of bismuth 2-ethylhexanoate at a concentration of 0.1 mol/l, 400 ml of a toluene solution of strontium 2-ethylhexanoate at a concentration of 0.1 mol/l, 1000 ml of a toluene solution of tantalum ethoxide at a concentration of 0.1 mol/l, and 100 g of 2-ethylhexanoic acid were mixed to prepare a mixed liquid. After refluxing the mixture while heating at 120° C. for one hour in a nitrogen atmosphere, the solvent was evaporated at atmospheric pressure. Toluene was added to the mixture so that the oxide concentration as $Sr_{0.8}Bi_{2.2}Ta_2O_x$(SBT) was 0.1 mol/l to obtain a main liquid.

A secondary liquid was obtained as follows. 2000 ml of a toluene solution of bismuth 2-ethylhexanoate at a concentration of 0.1 mol/l, 1500 ml of a toluene solution of germanium ethoxide at a concentration of 0.1 mol/l, and 100 g of 2-ethylhexanoic acid were mixed. After refluxing the mixture while heating at 120° C. for one hour in a nitrogen atmosphere, the solvent was evaporated at atmospheric pressure. Toluene was added to the mixture so that the oxide concentration as $Bi_4Ge_3O_{12}$ was 0.1 mol/l to obtain a secondary liquid.

The main liquid and the secondary liquid thus obtained were mixed to obtain seven types of mixed solutions with different volume mixing ratios. The volume mixing ratios of the main liquid to the secondary liquid were 100:1, 100:10, 100:20, 100:50, 100:100, 100:150, and 100:200.

Ferroelectric films were formed from each of these seven types of mixed liquid and a solution containing only the main liquid.

Figure 9:
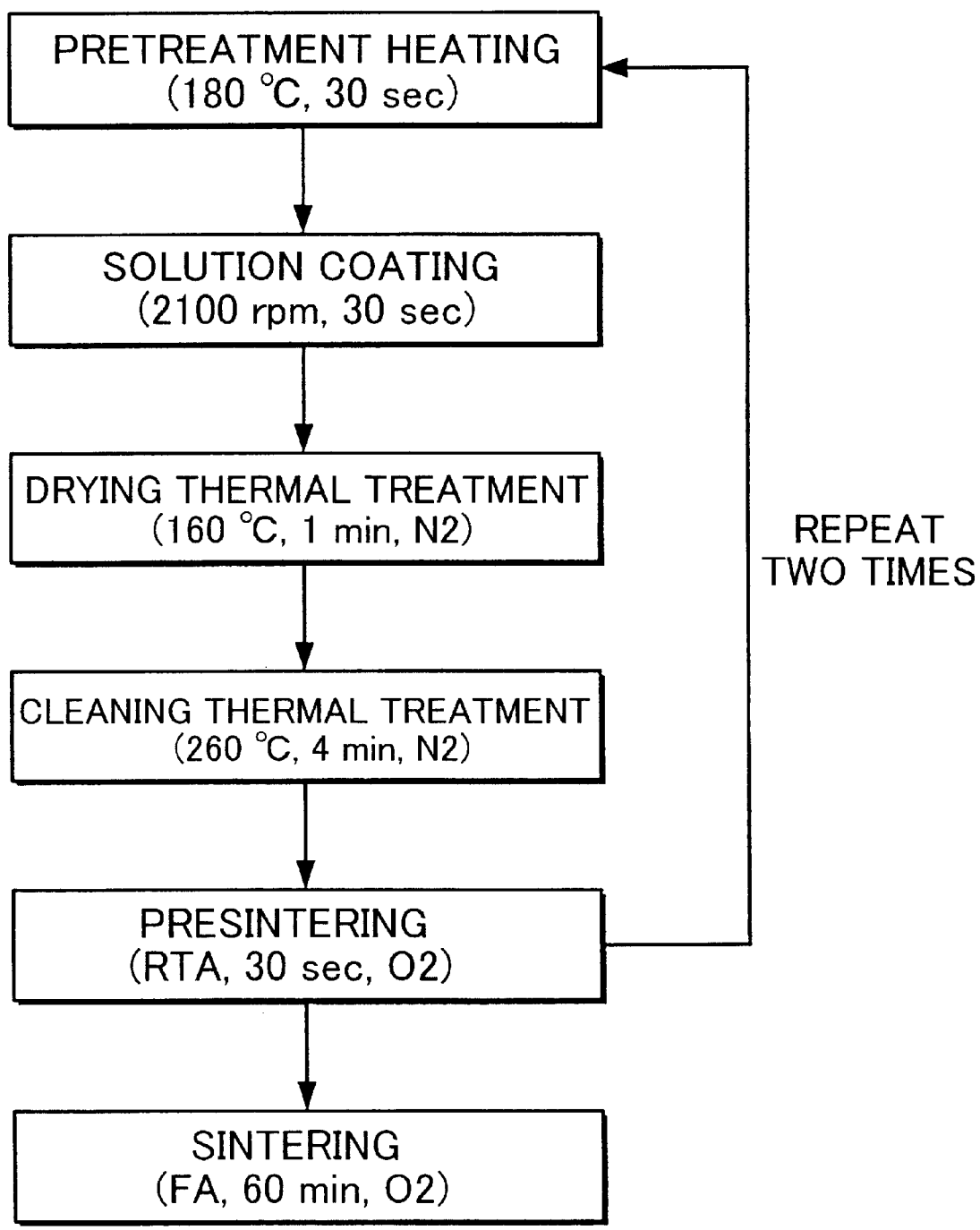
FIG. 9 is a flowchart showing a deposition process.

The deposition method is shown in FIG. 9. A series of steps consisting of a pretreatment heating step, a solution application step, a drying thermal treatment step, a cleaning thermal treatment step, and a presintering step was performed two times. The presintered product was sintered to form films. Specific conditions are given below. The pretreatment heating step was performed at 180° C. for 30 seconds. The mixed solution was applied for 30 seconds using a spin coater (2100 rpm). The drying thermal treatment step was performed at 160° C. for one minute in a nitrogen atmosphere. The cleaning thermal treatment step was performed at 260° C. for four minutes in a nitrogen atmosphere. Presintering was performed for 30 seconds in an oxygen atmosphere. The presintering temperatures are as shown in Table 1. Sintering was performed for 60 minutes in an oxygen atmosphere. The sintering temperatures are as shown in Table 1. The thickness of the deposited film was 50 nm.

The Pr (residual polarization value) of each ferroelectric film was measured. The measurement results for the Pr are shown in Table 1. The unit for Pr is $\mu$C/cm.

TABLE 1

| Volume mixing ratio (main liquid: secondary liquid) | Sintering temperature | | | | |
|---|---|---|---|---|---|
| | 400° C. | 450° C. | 500° C. | 600° C. | 700° C. |
| Only main liquid | ND | ND | ND | ND | 8 |
| 100:1 | ND | ND | ND | ND | 9 |
| 100:10 | ND | 1 | 2 | 3 | 8 |
| 100:20 | ND | 3 | 7 | 9 | 9 |
| 100:50 | ND | 5 | 8 | 8 | 9 |
| 100:100 | ND | 3 | 7 | 9 | 8 |
| 100:150 | ND | 3 | 2 | 3 | 5 |
| 100:200 | ND | 2 | 3 | 3 | 4 |

ND: Not detectable

It is difficult to fabricate a ferroelectric memory device in which the ferroelectric is SBT with a certain degree of integration at a sintering temperature exceeding 600° C. In the ferroelectric memory device, the Pr of the ferroelectric capacitors is preferably 7 or more. In Table 1, the volume mixing ratio (main liquid: secondary liquid) resulting in a Pr of 7 or more at a sintering temperature of 600° C. or less is between 100:20 and 100:100. Therefore, the volume mixing ratio of the main liquid to the secondary liquid is preferably in the range from 100:20 to 100:100.

The main liquid was prepared so that 0.1 mol of $Sr_{0.8}Bi_{2.2}Ta_2O_x$ was produced per liter of the main liquid. The secondary liquid was prepared so that 0.1 mol of $Bi_4Ge_3O_{12}$ was produced per liter of the secondary liquid. Therefore, the volume mixing ratio of the main liquid to the secondary liquid also shows the molar ratio of $Sr_{0.8}Bi_{2.2}Ta_2O_x$ produced from the main liquid and $Bi_4Ge_3O_{12}$ produced from the secondary liquid. Therefore, the main liquid and the secondary liquid are preferably mixed so that the molar ratio of $Sr_{0.8}Bi_{2.2}Ta_2O_x$ produced from the main liquid and $Bi_4Ge_3O_{12}$ produced from the secondary liquid is from 100:20 to 100:100.

In the case of a solution containing only the main liquid, specific characteristics relating to the Pr were obtained only at a sintering temperature of 700° C. or more. On the contrary, in the case of mixing the secondary liquid with the main liquid, specific characteristics relating to the Pr were obtained even at a sintering temperature of about 500° C. This shows that the process temperature can be decreased by depositing a ferroelectric film by mixing the secondary liquid with the main liquid.

Example 2

A main liquid was obtained as follows. 85.3 g of titanium isopropoxide and 139.2 g of bismuth butoxide were added to 1000 ml of 2-methoxyethanol. After refluxing the mixture while heating at 125° C. for one hour in a nitrogen atmosphere, the mixture was cooled to room temperature. After the addition of 23.7 g of lanthanum isopropoxide, the mixture was stirred at room temperature for two hours. After the addition of 1.3 g of water, the mixture was stirred at room temperature for one hour. 2-Methoxyethanol was added to the mixture so that the oxide concentration as $Bi_{3.25}La_{0.75}Ti_3O_{12}$ was 0.07 mol/l to obtain a main liquid.

A secondary liquid was obtained as follows. 75.9 g of germanium ethoxide and 171.3 g of bismuth butoxide were added to 1000 ml of 2-methoxyethanol. After refluxing the mixture while heating at 125° C. for one hour in a nitrogen atmosphere, the mixture was cooled to room temperature. After the addition of 1.3 g of water, the mixture was stirred at room temperature for one hour. 2-Methoxyethanol was added to the mixture so that the oxide concentration as $Bi_4Ge_3O_{12}$ was 0.07 mol/l to obtain a secondary liquid.

The main liquid and the secondary liquid thus obtained were mixed to obtain seven types of mixed liquid with different mixing ratios. The mixing ratios of the main liquid to the secondary liquid were 100:1, 100:10, 100:20, 100:50, 100:100, 100:150, and 100:200.

Ferroelectric films were formed from each of these seven types of mixed liquid and a solution containing only the main liquid. The deposition method was the same as in Example 1.

In Example 2, the same tendency as in Example 1 was observed relating to the Pr.

Example 3

A main liquid was obtained as follows. 81.2 g of tantalum ethoxide and 170 g of 2-ethylhexanoic acid were added to 100 ml of xylene. After the addition of 20.6 g strontium isopropoxide, the mixture was stirred at 120° C. for two hours. Xylene, the resulting alcohols, and an excess amount of 2-ethylhexanoic acid were evaporated at 180° C. under atmospheric pressure. 200 ml of a xylene solution of bismuth 2-ethylhexanoate at a concentration of 1.0 mol/l was added to the mixture. Xylene was added to the mixture so that the oxide concentration as $SrBi_2Ta_2O_x$ was 0.2 mol/l. Then, butyl acetate was added to the mixture so that the oxide concentration as $SrBi_2Ta_2O_x$ was 0.1 mol/l to obtain a main liquid.

A secondary liquid was obtained as follows. 500 ml of a xylene solution of tungsten ethoxide at a concentration of 0.1 mol/l and 100 g of 2-ethylhexanoic acid were mixed with 1000 ml of a xylene solution of bismuth 2-ethylhexanoate at a concentration of 0.1 mol/l. After refluxing the mixture while heating at 120° C. for one hour in a nitrogen atmosphere, the solvent was evaporated at atmospheric pressure. Xylene was added to the mixture so that the oxide concentration as $Bi_2WO_6$ was 0.1 mol/l to obtain a secondary liquid.

The main liquid and the secondary liquid thus obtained were mixed to obtain seven types of mixed liquid with different volume mixing ratios. The volume mixing ratios of the main liquid to the secondary liquid were 100:1, 100:10, 100:20, 100:50, 100:100, 100:150, and 100:200.

Ferroelectric films were formed from each of these seven types of mixed liquid and a solution containing only the main liquid. The deposition method was the same as in Example 1.

In Example 3, the same tendency as in Example 1 was observed relating to the Pr.

Example 4

A main liquid was obtained as follows. 37.93 g of lead acetate trihydrate, 19.95 g of zirconium butoxide, and 13.64 g of titanium isopropoxide were added to 100 ml of 1-methoxy-2-propanol. The mixture was refluxed while heating at 120° C. for one hour in a nitrogen atmosphere. After the addition of 4.5 g of acetylacetone and 1.1 g of water, the solvent was evaporated at atmospheric pressure. 1-Methoxy-2-propanol was added to the mixture so that the oxide concentration as $Pb(Zr_{0.52}Ti_{0.48})O_3$ was 0.3 mol/l to obtain a main liquid.

A secondary liquid was obtained as follows. 200 ml of a 1-methoxy-2-propanol solution of germanium ethoxide at a concentration of 0.5 mol/l and 250 ml of a 1-methoxy-2-propanol solution of lead butoxide at a concentration of 0.5 mol/l were mixed. After refluxing the mixture while heating at 120° C. for one hour in a nitrogen atmosphere, the mixture was cooled to room temperature. After the addition of 4.1 g of acetylacetone and 1.0 g of water, the solvent was evaporated at atmospheric pressure. 1-Methoxy-2-propanol was added to the mixture so that the oxide concentration as $Pb_5Ge_3O_{11}$ was 0.15 mol/l to obtain a secondary liquid.

The main liquid and the secondary liquid thus obtained were mixed to obtain seven types of mixed liquid with different volume mixing ratios. The volume mixing ratios of the main liquid to the secondary liquid were 100:1, 100:10, 100:20, 100:50, 100:100, 100:150, and 100:200.

Ferroelectric films were formed from each of these seven types of mixed liquid and a solution containing only the main liquid. The deposition method was the same as in Example 1.

In Example 4, the same tendency as in Example 1 was observed relating to the Pr.

Experimental Example Relating to Surface Morphology

Experimental results for the surface morphology are described below.

Figure 10:
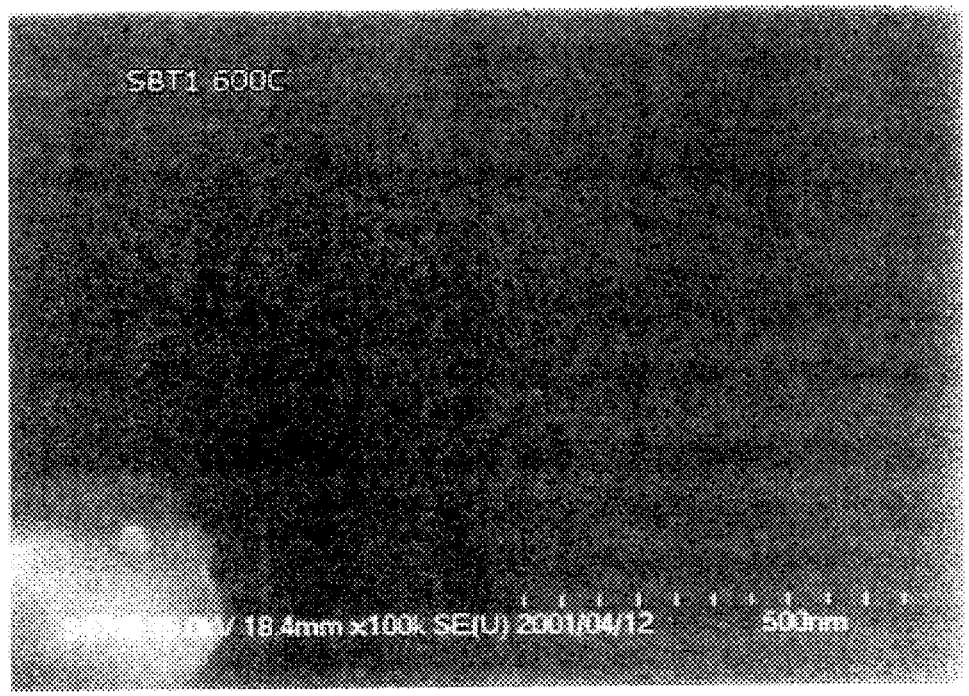
FIG. 10 shows a micrograph of a ferroelectric film obtained from a mixed liquid of a main liquid and a sub liquid according to Example 1.
Figure 11:
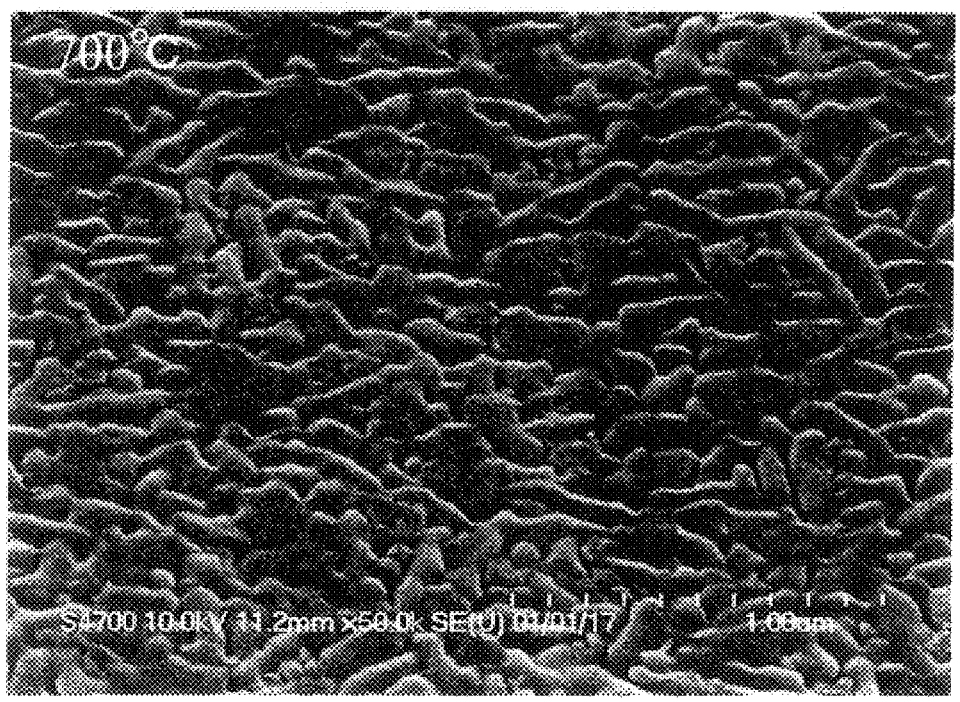
FIG. 11 shows a micrograph of a ferroelectric film according to a Comparative Example.

FIG. 10 is a micrograph of the ferroelectric film obtained from the mixed liquid of the main liquid and the secondary liquid according to Example 1. FIG. 11 is a micrograph of a ferroelectric film according to the Comparative Example.

The ferroelectric film according to Example 1 shown in FIG. 10 is a ferroelectric film in which the volume mixing ratio of the main liquid to the secondary liquid was 100:100. The ferroelectric film according to the Comparative Example was obtained by depositing a solution containing only the main liquid illustrated in Example 1 using the deposition method of Example 1. The thickness of the ferroelectric films was 50 nm in both Example 1 and the Comparative Example.

As shown in FIGS. 10 and 11, the surface morphology of the ferroelectric film according to the Example was significantly improved compared to the ferroelectric film according to the Comparative Example.

Various modifications and variations of the present invention are possible within the scope of the above embodiments.

What is claimed is:

1. A method of manufacturing a ceramic film, comprising a step of forming a ceramic film by crystallizing a raw material body,
   wherein the raw material body includes raw materials in a mixed state; and
   wherein the raw materials differ from one another in at least one of a crystal growth condition and a crystal growth mechanism in the crystallization of the raw materials.

2. The method of manufacturing a ceramic film as defined in claim 1,
   wherein at least two of the raw materials differ from each other in a crystallization temperature in the crystallization of the raw materials.

3. The method of manufacturing a ceramic film as defined in claim 1,
   wherein at least two of the raw materials differ from each other in a crystal nucleus formation temperature in the crystallization of the raw materials.

4. The method of manufacturing a ceramic film as defined in claim 1,
   wherein at least two of the raw materials differ from each other in a crystal growth temperature in the crystallization of the raw materials.

5. The method of manufacturing a ceramic film as defined in claim 1,
   wherein at least two of the raw materials differ from each other in a crystal growth rate in the crystallization of the raw materials.

6. The method of manufacturing a ceramic film as defined in claim 1,
   wherein at least two of the raw materials differ from each other in a crystal nucleus formation rate in the crystallization of the raw materials.

7. The method of manufacturing a ceramic film as defined in claim 1,
   wherein at least two of the raw materials differ from each other in the size of crystal nuclei in the crystallization of the raw materials.

8. The method of manufacturing a ceramic film as defined in claim 1,
   wherein at least two of the raw materials differ from each other in a crystallization method for the raw materials.

9. The method of manufacturing a ceramic film as defined in claim 1,
   wherein there is a time-lag between the crystallizations of the raw materials.

10. The method of manufacturing a ceramic film as defined in claim 1,
    wherein there is a time-lag between the formations of crystal nuclei in the crystallization of the raw materials.

11. The method of manufacturing a ceramic film as defined in claim 1,
    wherein the raw materials are crystallized at the same time.

12. The method of manufacturing a ceramic film as defined in claim 1,
    wherein, when ceramics obtained from the raw materials are expressed as $(Bi_2O_2)^{2+}(A_{m-1}B_mO_{3m+1})^{2-}$, the raw materials have different values for m.

13. The method of manufacturing a ceramic film as defined in claim 1,
    wherein the raw material body is formed on a substrate by the liquid source misted chemical deposition (LSMCD) method; and
    wherein the raw material body is formed on the substrate by separately providing the raw materials.

14. The method of manufacturing a ceramic film as defined in claim 1,
    wherein the raw material body includes a sol-gel raw material and an MOD raw material.

15. The method of manufacturing a ceramic film as defined in claim 1,
    wherein the raw material body includes sol-gel raw materials; and wherein the sol-gel raw materials differ from one another in one of a degree of polycondensation and a metal element composition.

16. The method of manufacturing a ceramic film as defined in claim 1,
    wherein the raw material body includes sol-gel raw materials; and
    wherein the sol-gel raw materials are not mixed at an atomic level.

17. A method of manufacturing a ceramic film, comprising a step of forming a ceramic film by crystallizing a raw material body,
    wherein the raw material body includes raw materials in a mixed state; and
    wherein the raw materials differ from one another in crystal structures produced from the raw materials.

18. A method of manufacturing a ceramic film, comprising a step of forming a ceramic film by crystallizing a raw material body,
    wherein the raw material body includes raw materials in a mixed state; and
    wherein the raw materials are individually crystallized at least at an initial stage of crystallization.

19. A method of manufacturing a ceramic film comprising a step of forming a ceramic film by crystallizing a raw material body,
    wherein the raw material body is crystallized into a plurality of phases.

20. The method of manufacturing a ceramic film as defined in claim 19,
    wherein the ceramic film is a ferroelectric film.

21. The method of manufacturing a ceramic film as defined in claim 19,
    wherein the ceramic film includes a ferroelectric and a paraelectric in a mixed state.

22. A method of manufacturing a ceramic film comprising:
    a step of forming a ceramic film by crystallizing a ceramic raw material liquid which includes a first raw material liquid and a second raw material liquid,
    wherein the first raw material liquid is used to produce a ferroelectric having a Bi-based layered perovskite structure; and
    wherein the second raw material liquid is used to produce an ABO oxide in which Bi is provided in the A site.

23. The method of manufacturing a ceramic film as defined in claim 22,
    wherein a molar ratio of the ferroelectric produced from the first raw material liquid to the ABO oxide produced from the second raw material liquid is from 100:20 to 100:100.

24. The method of manufacturing a ceramic film as defined in claim 22,
    wherein the first raw material liquid is a solution in which a metal compound or a metal-inorganic compound of a metal element for the ferroelectric is dissolved in a solvent; and
    wherein the second raw material liquid is a solution in which a metal compound or a metal-inorganic compound of a metal element for the ABO oxide is dissolved in a solvent.

25. A method of manufacturing a ceramic film comprising:
    a step of forming a ceramic film by crystallizing a ceramic raw material liquid which includes a third raw material liquid and a fourth raw material liquid,
    wherein the third raw material liquid is used to produce a PZT ferroelectric; and
    wherein the fourth raw material liquid is used to produce an ABC oxide in which Pb is provided in the A site.

26. The method of manufacturing a ceramic film as defined in claim 25,
    wherein a molar ratio of the ferroelectric produced from the third raw material liquid to the ABO oxide produced from the fourth raw material liquid is from 100:20 to 100:100.

27. The method of manufacturing a ceramic film as defined in claim 25,
    wherein the third raw material liquid is a solution in which a metal compound or a metal-inorganic compound of a metal element for the ferroelectric is dissolved in a solvent; and
    wherein the fourth raw material liquid is a solution in which a metal compound or a metal-inorganic compound of a metal element for the ABO oxide is dissolved in a solvent.

28. A method of manufacturing a ceramic film comprising:
    a step of forming a ceramic film by crystallizing a ceramic raw material liquid which includes a fifth raw material liquid and a sixth raw material liquid,
    wherein the fifth raw material liquid is used to produce a ferroelectric having a Bi-based layered perovskite structure or a PZT ferroelectric; and
    wherein the sixth raw material liquid is used to produce an ABO oxide in which Ge is provided in the B site.

29. The method of manufacturing a ceramic film as defined in claim 28,
    wherein a molar ratio of the ferroelectric produced from the fifth raw material liquid to the ABO oxide produced from the sixth raw material liquid is from 100:20 to 100:100.

30. The method of manufacturing a ceramic film as defined in claim 28,
    wherein the fifth raw material liquid is a solution in which a metal compound or a metal-inorganic compound of a metal element for the ferroelectric is dissolved in a solvent; and
    wherein the sixth raw material liquid is a solution in which a metal compound or a metal-inorganic compound of a metal element for the ABO oxide is dissolved in a solvent.

31. A method of manufacturing a ceramic film comprising:
    a step of forming a raw material body layer in which a plurality of raw material layers are layered; and
    a step of forming a ceramic film by crystallizing the raw material body layer,
    wherein an uppermost raw material layer in the raw material body layer has a crystallization temperature lower than a crystallization temperature of a lower raw material layer which is in contact with the uppermost raw material layer, and produces crystals having no layered structure.

32. The method of manufacturing a ceramic film as defined in claim 31,
    wherein the lower raw material layer which is in contact with the uppermost raw material layer is formed on a substrate with a first raw material layer interposed; and
    wherein the first raw material layer has a crystallization temperature lower than the crystallization temperature of the lower raw material layer which is in contact with the uppermost raw material layer.

33. The method of manufacturing a ceramic film as defined in any one of claims 1, 17, 18, 22, 25, 28 or 31,
wherein the step of forming a ceramic film by crystallizing the raw material body is repeatedly performed two or more times.

34. A ceramic film obtained by the method of manufacturing a ceramic film as defined in any one of claims 1, 17, 18, 22, 25, 28 or 31.

35. A semiconductor device comprising a capacitor including the ceramic film as defined in claim 34.

36. A piezoelectric device comprising the ceramic film as defined in claim 35.

37. A method of manufacturing a ceramic film comprising:
a step of forming a raw material body layer which includes a raw material laminate in which a first raw material layer, a second raw material layer, and a third raw material layer are layered in that order; and
a step of forming a ceramic film by crystallizing the raw material body layer,
wherein the second raw material layer has a crystallization temperature lower than crystallization temperatures of the first and third raw material layers.

38. The method of manufacturing a ceramic film as defined in claim 37,
wherein a fourth raw material layer is further layered on the third raw material layer; and
wherein the fourth raw material layer has a crystallization temperature lower than the crystallization temperature of the third raw material layer.

39. A method of manufacturing a ceramic film comprising:
a step of forming a raw material body layer in which a plurality of raw material layers are layered; and
a step of forming a ceramic film by crystallizing the raw material body layer,
wherein an uppermost raw material layer in the raw material body layer has a crystallization temperature higher than a crystallization temperature of a lower raw material layer which is in contact with the uppermost raw material layer.

40. The method of manufacturing a ceramic film as defined in claim 39,
wherein crystals obtained from the uppermost raw material layer in the raw material body layer have no layered structure.

41. A method of manufacturing a ceramic film, comprising a step of forming a ceramic film by crystallizing a raw material body, the ceramic film being a ferroelectric film,
wherein the raw material body includes raw materials in a mixed state; and
wherein the raw materials differ from one another in at least one of a crystal growth condition and a crystal growth mechanism in the crystallization of the raw materials.

42. A method of manufacturing a ceramic film, comprising a step of forming a ceramic film by crystallizing a raw material body, the ceramic film being a ferroelectric film,
wherein the raw material body includes raw materials in a mixed state; and
wherein the raw materials differ from one another in crystal structures produced from the raw materials.

43. A method of manufacturing a ceramic film, comprising a step of forming a ceramic film by crystallizing a raw material body, the ceramic film being a ferroelectric film,
wherein the raw material body includes raw materials in a mixed state; and
wherein the raw materials are individually crystallized at least at an initial stage of crystallization.

44. A method of manufacturing a ceramic film, comprising a step of forming a ceramic film by crystallizing a raw material body, the ceramic film including ferroelectric and paraelectric materials in a mixed state,
wherein the raw material body includes raw materials in a mixed state; and
wherein the raw materials differ from one another in at least one of a crystal growth condition and a crystal growth mechanism in the crystallization of the raw materials.

45. A method of manufacturing a ceramic film, comprising a step of forming a ceramic film by crystallizing a raw material body, the ceramic film including ferroelectric and paraelectric materials in a mixed state,
wherein the raw material body includes raw materials in a mixed state; and
wherein the raw materials differ from one another in crystal structures produced from the raw materials.

46. A method of manufacturing a ceramic film, comprising a step of forming a ceramic film by crystallizing a raw material body, the ceramic film including ferroelectric and paraelectric materials in a mixed state,
wherein the raw material body includes raw materials in a mixed state; and
wherein the raw materials are individually crystallized at least at an initial stage of crystallization.

* * * * *